US011808353B2

(12) United States Patent
Carson

(10) Patent No.: US 11,808,353 B2
(45) Date of Patent: Nov. 7, 2023

(54) SEAL INSERTION TOOL FOR A FLUID DELIVERY MODULE AND METHOD OF INSTALLING A SEAL INTO A FLUID DELIVERY MODULE

(71) Applicant: Ichor Systems, Inc., Fremont, CA (US)

(72) Inventor: Stephen Carson, Woodstock, NY (US)

(73) Assignee: Ichor Systems, Inc.

( * ) Notice: Subject to any disclaimer, the term of this patent is extended or adjusted under 35 U.S.C. 154(b) by 203 days.

(21) Appl. No.: 17/319,196

(22) Filed: May 13, 2021

(65) Prior Publication Data

US 2021/0364087 A1    Nov. 25, 2021

Related U.S. Application Data

(60) Provisional application No. 63/026,780, filed on May 19, 2020.

(51) Int. Cl.
*F16J 15/06* (2006.01)
*F16J 15/10* (2006.01)
*H01L 21/67* (2006.01)

(52) U.S. Cl.
CPC ........... *F16J 15/061* (2013.01); *F16J 15/104* (2013.01); *H01L 21/67017* (2013.01); *Y10T 29/49872* (2015.01)

(58) Field of Classification Search
CPC ......... H01L 21/67017; Y10T 29/49872; B25B 27/0028
USPC ........................................ 29/235, 237, 238
See application file for complete search history.

(56) References Cited

U.S. PATENT DOCUMENTS

| | | | | |
|---|---|---|---|---|
| 6,012,209 A | * | 1/2000 | Whetstone | B23P 19/084 29/235 |
| 6,481,640 B1 | | 11/2002 | Carey et al. | |
| 8,973,615 B2 | * | 3/2015 | Hoshi | F16K 27/003 248/225.11 |
| 9,982,795 B2 | * | 5/2018 | Twelftree | F16K 27/003 |
| 2002/0000256 A1 | | 1/2002 | Eidsmore et al. | |
| 2007/0186399 A1 | | 8/2007 | Bussell et al. | |
| 2012/0139190 A1 | | 6/2012 | Doyle | |
| 2016/0312656 A1 | * | 10/2016 | Pergantis | B25B 27/023 |

(Continued)

FOREIGN PATENT DOCUMENTS

| | | |
|---|---|---|
| JP | 2010-156368 | 7/2010 |
| KR | 10-0816263 | 3/2008 |
| WO | WO2007/083203 | 7/2007 |

OTHER PUBLICATIONS

International Search Report and Written Opinion issued in PCT/US2021/032157, dated Aug. 23, 2021, pp. 1-11.

*Primary Examiner* — Lee D Wilson
*Assistant Examiner* — Shantese L McDonald
(74) *Attorney, Agent, or Firm* — The Belles Group, P.C.

(57) ABSTRACT

Apparatuses for controlling fluid flow are important components for delivering process fluids for semiconductor fabrication. These apparatuses for controlling fluid flow require a variety of fluid flow components which are tightly packaged within the apparatuses for controlling flow. Servicing the apparatuses requires specialized equipment and methods which enable installation of seals in close quarters in apparatuses which are installed in the field. Seal insertion tools may be used to facilitate installation of the seals to permit efficient assembly of fluid flow components into apparatus for controlling flow.

18 Claims, 25 Drawing Sheets

(56) References Cited

U.S. PATENT DOCUMENTS

2018/0339379 A1  11/2018  Noda et al.
2019/0299378 A1  10/2019  Horning et al.

* cited by examiner

SEAL INSERTION TOOL FOR A FLUID DELIVERY MODULE AND METHOD OF INSTALLING A SEAL INTO A FLUID DELIVERY MODULE

CROSS-REFERENCE TO RELATED APPLICATIONS

This application claims the benefit of U.S. Provisional Application 63/026,780, filed May 19, 2020, which is incorporated herein by reference in its entirety.

BACKGROUND

Flow control has been one of the key technologies in semiconductor chip fabrication. Apparatuses for controlling fluid flow are important for delivering known flow rates of process fluids for semiconductor fabrication and other industrial processes. Such devices are used to measure and accurately control the flow of fluids for a variety of applications. This control relies on apparatuses which have components that are quickly and reliably assembled with minimal seal leakage.

As the technology of chip fabrication has improved, the component size has decreased and packaging requirements have become tighter for the apparatuses for controlling flow. Maintenance and repair of apparatuses for controlling flow increasingly involves installing seals and components in tight quarters. In order to improve the speed and ease of maintenance, improved methods and equipment are desired.

BRIEF SUMMARY

The present technology is directed to a seal insertion tool for use in installing a seal to a component mounting location in an apparatus for controlling flow in a fluid delivery module. Apparatuses for controlling flow have a large number of components which must be assembled without leakage in order to function. Such apparatuses may be used in a wide range of processes such as semiconductor chip fabrication, solar panel fabrication, and the like.

In one implementation, the invention is a method of installing an annular seal in a fluid delivery module of a fluid supply line that extends from a fluid source to a process chamber. First, a seal insertion tool is coupled with a first substrate block of the fluid delivery module. The seal insertion tool is loaded with an annular seal. The seal insertion tool is coupled so that the annular seal is positioned above and aligned with a first fluid port located on a first surface of the first substrate block. Second, the seal insertion tool is actuated so that the seal insertion tool lowers the annular seal and presses a lower portion of the annular seal into a first annular groove of the first fluid port that surrounds a first fluid opening of the first fluid port. The first and second steps are performed while the fluid delivery module remains in-situ within the fluid supply line.

In yet another implementation, the invention is a method of replacing an annular seal in a fluid delivery module. First an active flow component is decoupled from a first substrate block of the fluid delivery module by releasing one or more component fasteners that respectively engage one or more anchors of the fluid delivery module, thereby exposing a first fluid port on a first surface of the first substrate block. Second, an expired seal is removed. Third, a seal insertion tool is coupled to the first substrate block by activating one or more tool fasteners to engage the one or more anchors of the fluid delivery module. Fourth, the seal insertion tool is actuated so that an annular seal that is aligned with the first fluid port is pressed into a first annular groove of the first fluid port that surrounds a first fluid opening of the first fluid port.

In another implementation, the invention is a method of installing an annular seal in a fluid delivery module comprising a support structure, a first substrate block mounted to the support structure, and a plurality of flow components mounted to the support structure. First, a seal insertion tool loaded with an annular seal to the first substrate block, the annular seal positioned above and aligned with a first fluid port located on a first surface of the first substrate block. Second, the seal insertion tool is actuated so that the seal insertion tool presses a lower portion of the annular seal into a first annular groove of the first fluid port that surrounds a first fluid opening of the first fluid port. The first and second steps are performed while the first substrate block remains mounted to the support structure of the fluid delivery module.

In yet another implementation, the invention is a method of manufacturing semiconductors or integrated circuits. First, an annular seal of a fluid delivery module is installed or replaced according to the methods above to complete a fluid supply line that extends from a fluid source to a process chamber. Second, fluid is flowed from the fluid source to the process chamber to contact one or more semiconductor or integrated circuit wafers in the process chamber.

In an alternate implementation, the invention is a seal insertion tool. The seal insertion tool has a body, a pair of fasteners for coupling the body to a fluid delivery module, an end effector slidably mounted to the body, the end effector configured to receive and retain an annular seal, and an actuator operably coupled to the end effector and configured to alter the end effector from a raised state to a lowered state upon a user actuating the actuator.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

Figure 1:
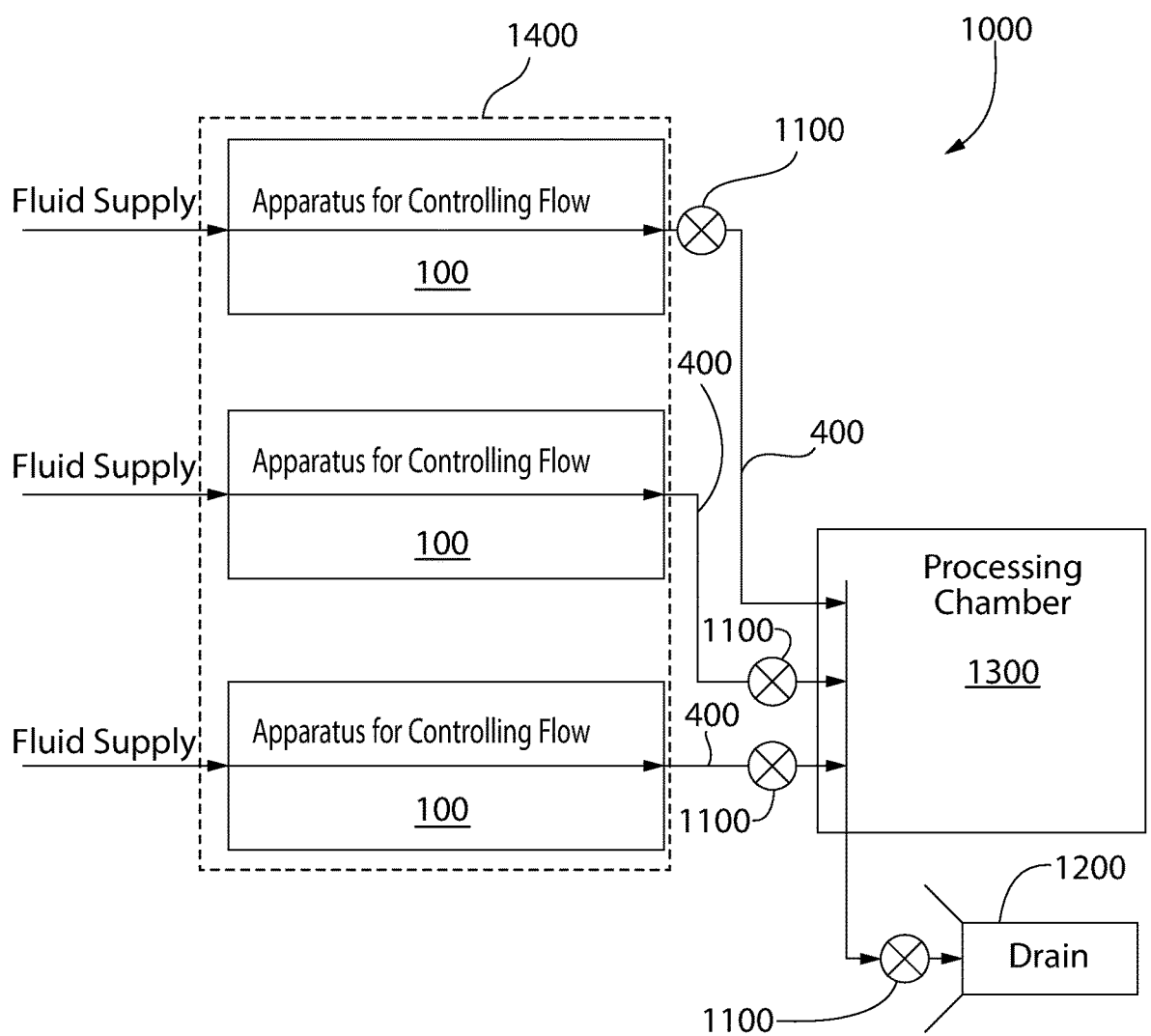
FIG. 1 is a schematic of a system for manufacturing semiconductor devices utilizing one or more apparatuses for controlling flow.

All drawings are schematic and not necessarily to scale. Features shown numbered in certain figures which may appear un-numbered in other figures are the same features unless noted otherwise herein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a seal retainer for use in installing fluid flow components to form a flow control apparatus. Semiconductor fabrication is one industry which demands high performance in control of fluid flows. As semiconductor fabrication techniques have advanced, customers have recognized the need for flow control devices with decreased space requirements. Thus, servicing and maintenance of flow control equipment has grown increasingly difficult as packaging of flow control devices grows denser than ever. The present invention facilitates efficient assembly of a flow control component within a flow control apparatus.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies, or fluid sources. Collectively, the plurality of apparatus for controlling flow 100 belong to a fluid delivery module 1400. Optionally, more than one fluid delivery module 1400 may be utilized in the processing system 100. The plurality of apparatus for controlling flow 100 are connected to the processing chamber 1300 by an outlet manifold 400. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a drain 1200 which is isolated from the processing chamber 1300 by a valve 1100 to enable evacuation of process fluids or facilitate purging one or more of the apparatus for controlling flow 100 to enable switching between process fluids in the same apparatus for controlling flow 100. Optionally, the drain 1200 may be a source of vacuum or may be a liquid drain configured to remove liquids from the processing chamber 1300. Optionally, the apparatus for controlling flow 100 may be mass flow controllers, flow splitters, or any other device which controls the flow of a process fluid in a processing system. Furthermore, the valves 1100 may be integrated into the apparatus for controlling flow 100 if so desired.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, electroplating, or any other process utilizing fluids.

Figure 2:
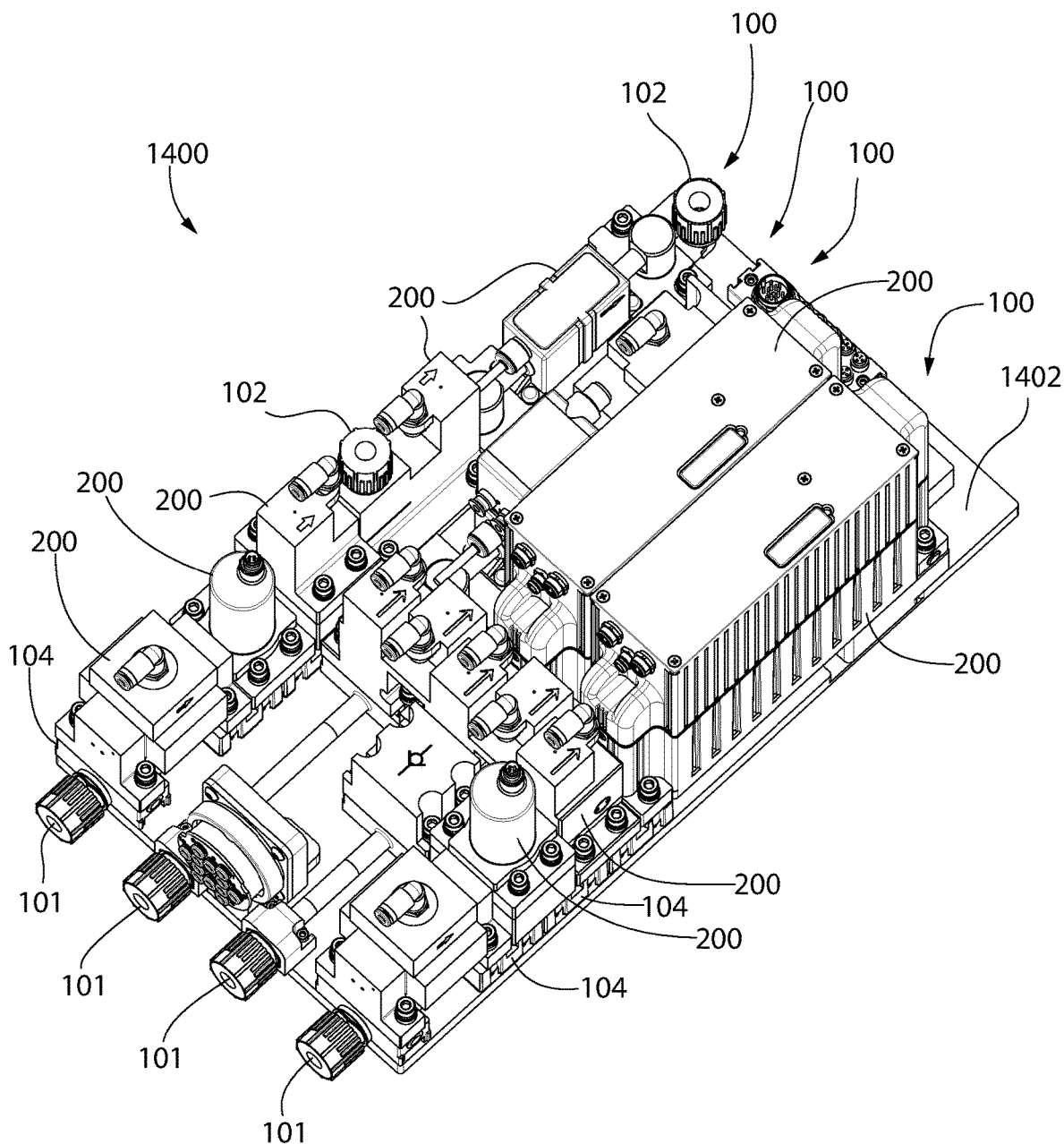
FIG. 2 is a perspective view of a fluid delivery module comprising a plurality apparatuses for controlling flow as may be utilized in the process of FIG. 1.
Figure 3:
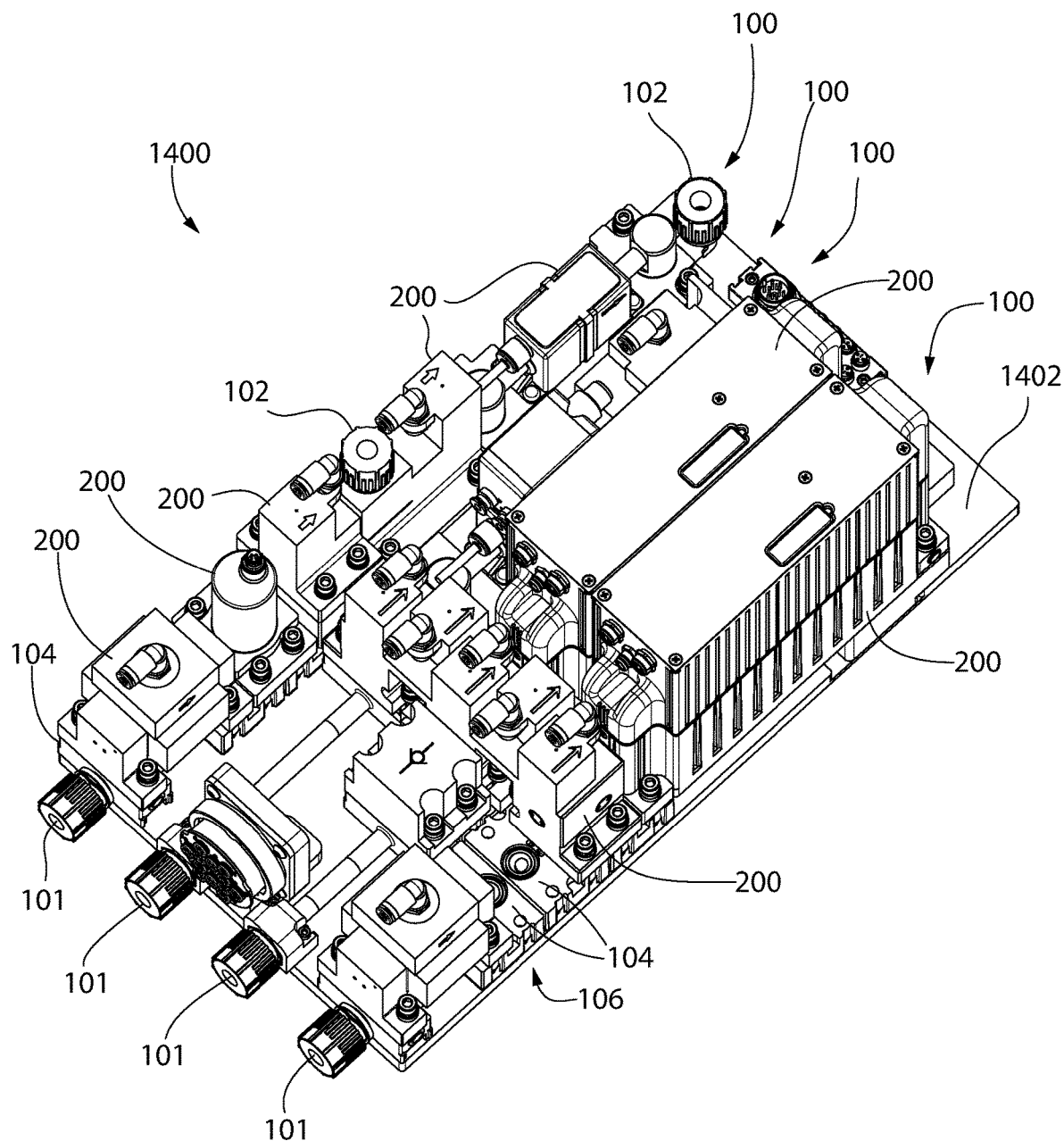
FIG. 3 is a perspective view of the module of FIG. 2 showing one fluid flow component removed.

FIGS. 2 and 3 show a schematic of an exemplary fluid delivery module 1400. In this embodiment, the fluid delivery module 1400 has a plurality of apparatus for controlling flow 100 having a plurality of inlets 101 and a plurality of outlets 102. In some embodiments, the plurality of inlets 101 do not correspond to the plurality of outlets 102 in a one to one manner. Instead, a plurality of inlets 101 may be joined into a single outlet 102 and a single inlet 101 may be split into a plurality of outlets 102. This may be done to achieve mixing or combination of different fluids prior to providing them to the process chamber 1300.

As can be seen, each of the apparatus for controlling flow 100 is arranged generally in a row, with the plurality of apparatus 100 in parallel rows. This need not be the case, and any packaging configuration may be used. The fluid delivery module 1400 has a substrate panel 1402. The substrate panel 1402 serves as support structure for the fluid delivery module 1400, but it may be simply used to facilitate assembly. Other structural support configurations are contemplated. A plurality of substrate blocks 104 rest on the substrate panel 1402 and comprise fluid ports therein to conduct flow to one or more fluid flow components 200 having corresponding fluid ports as discussed in greater detail below. The fluid flow components 200 may be considered active components while the substrate blocks 104 may be considered passive components. The fluid flow components 200 may be one or more of a valve, a flow controller, a pressure transducer, a flow measurement sensor, a pressure regulator, a flow restrictor, or an actuator, or any other known flow control component. A plurality of anchors are used to couple the fluid flow components 200 to the substrate blocks 104. The anchors may be threaded inserts or threads in the substrate blocks 104, threaded inserts or threads in the substrate panel 1402, nuts, or other anchoring features which permit secure fastening of the fluid flow components 200.

As can be seen by comparing FIG. 2 with FIG. 3, a fluid flow component 200 is removed from the fluid delivery module 1400 of FIG. 3. The removal of the fluid flow component 200 exposes portions of two substrate blocks 104. A component mounting location 106 is formed by the portions of the two substrate blocks 104. The component mounting location 106 may vary in size depending on the dimensions of the component 200 mounted to the component mounting location 106. Thus, different component mounting locations 106 may comprise different portions of the same substrate block 104. Each and every component 200 has a component mounting location 106 in the fluid delivery module 1400.

Turning to FIGS. 4A-D, a portion of the fluid delivery module 1400 is shown. Specifically, a fluid flow component 200 is shown mounted to a pair of substrate blocks 104 which form a component mounting location 106. The fluid flow component 200 is mounted to the substrate blocks 104 via component fasteners 250. The component fasteners 250 may be used for alignment as well as for fastening and may be replaced by any suitable type of fastener capable of fastening the fluid flow components 200 to the substrate blocks 104. The component fasteners 250 may be fasteners such as bolts, screws, pins, or other known fastening device. However, in other embodiments, the component fasteners 250 may be separate from the alignment features. For instance, dowel pins or other pins may be used to align the fluid flow component 200 to the substrate blocks 104. Then, a separate component fastener may be used for fastening the fluid flow component 200 to the substrate blocks 104. As can be seen in FIGS. 4A-D, the component fasteners 250 extend through the substrate blocks 104.

Although not shown in FIGS. 4A-D, the substrate panel 1402 has anchors. The anchors comprise portions of the substrate panel 1402 which are threaded or have threaded inserts which receive the component fasteners 250. Thus, the component fasteners 250 extend through fastener passageways 208 in the fluid flow component 200, fastener passageways 108 in the substrate blocks 104, and install into anchors in the substrate panel 1402. The component fasteners 250 are intended for rough alignment, but precision alignment is provided by other geometry. Thus, the fastener passageways 108, 208 need not be a precision fit on the component fasteners 250. In alternate embodiments, the component fasteners 250 may install directly to the substrate blocks 104 via threaded holes or inserts within the fastener passageways 108. In these embodiments, the substrate blocks 104 may be separately attached to the substrate panel 1402 via additional fasteners. In other embodiments, the component fasteners 250 may install into supports or other components which are beneath the substrate panel 1402.

Figure 4A:
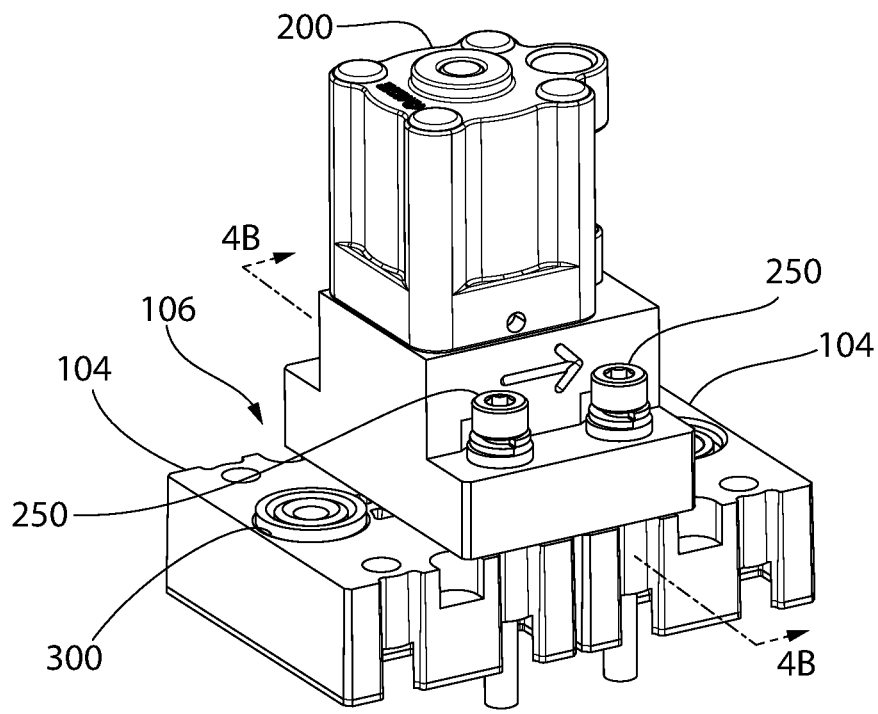
FIG. 4A is a perspective view of a component mounted to a pair of substrate blocks.
Figure 4B:
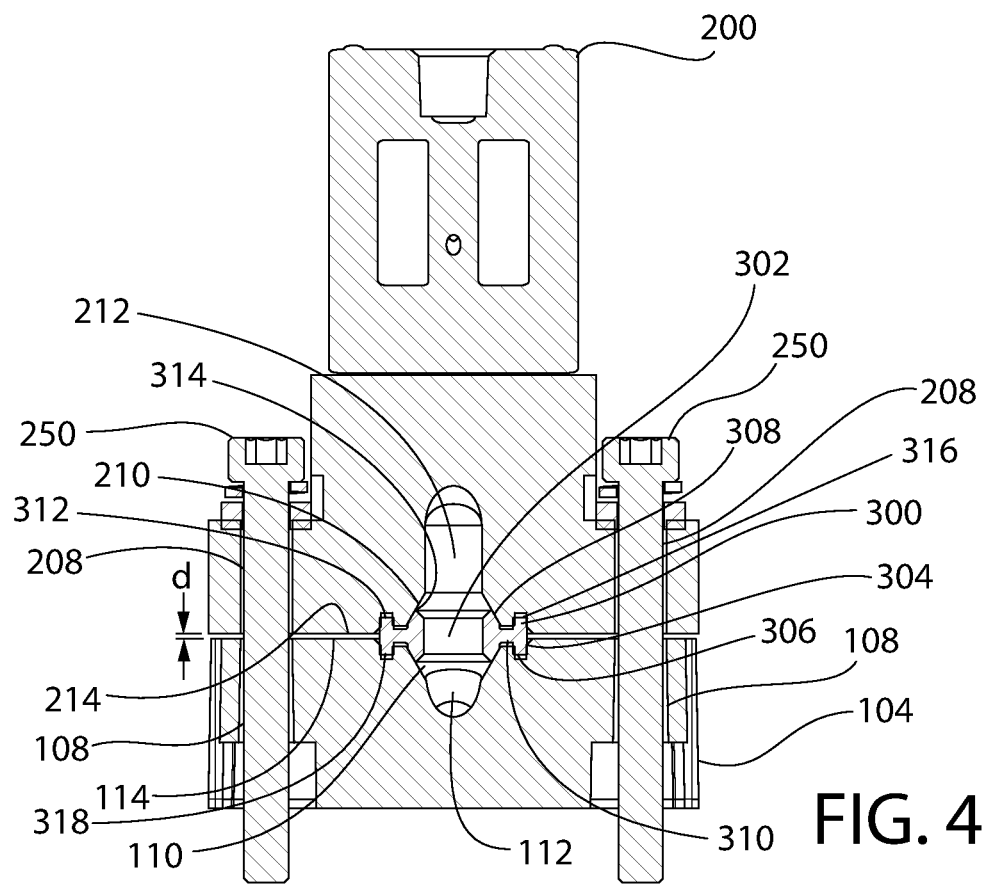
FIG. 4B is a cross-sectional view of the component and one of the substrate blocks of FIG. 4A, taken along line 4B-4B.

As best shown in FIG. 4B, an annular seal 300 is positioned between the fluid flow component 200 and the substrate block 104. The annular seal 300 is a seal having an annular configuration with a cylindrical outer surface 304, an outer upstanding ring wall 306, an inner upstanding ring wall 308, and a flange 310 connecting the inner and outer upstanding ring walls 308, 306. The outer upstanding ring wall 306 has a top surface 312. The seal 300 is also divided into an upper portion 316 and a lower portion 318, the upper portion 316 being the upper half of the seal and the lower portion 318 being a lower portion of the seal. The seal 300 also has a flow path 302 through the center which permits passage of fluid therethrough. The seal 300 provides a hermetic seal between a fluid port 210 of the fluid flow component 200 and a fluid port 110 of the substrate block 104. Each of the fluid ports 110 of the substrate block 104 comprises an annular groove 116. Each of the fluid ports 210 of the fluid flow component 200 comprises an annular groove 216. Each of the fluid ports 110 of the substrate blocks 104 comprises an annular groove 116.

Figure 4C:
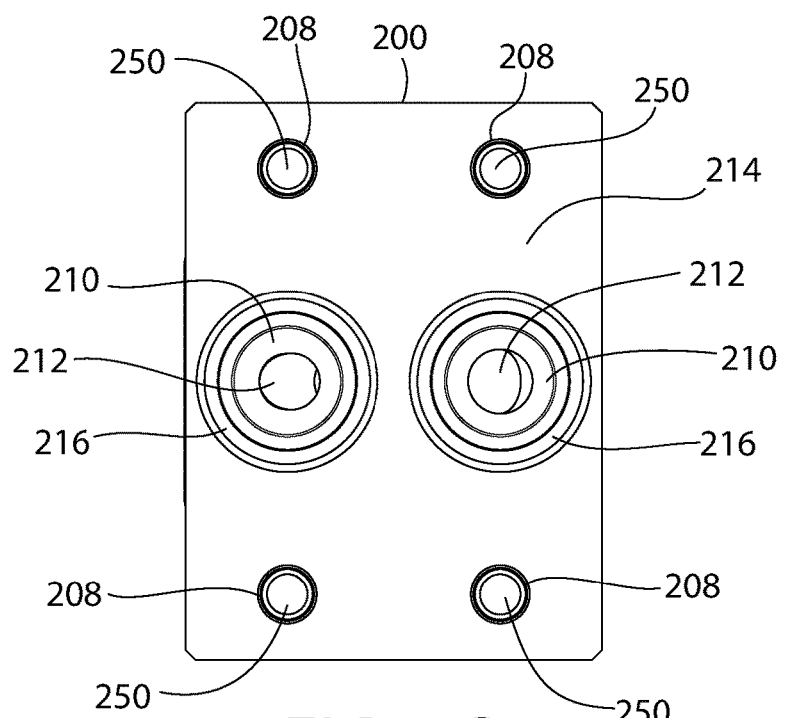
FIG. 4C is a bottom view of the component of FIG. 4A.
Figure 4D:
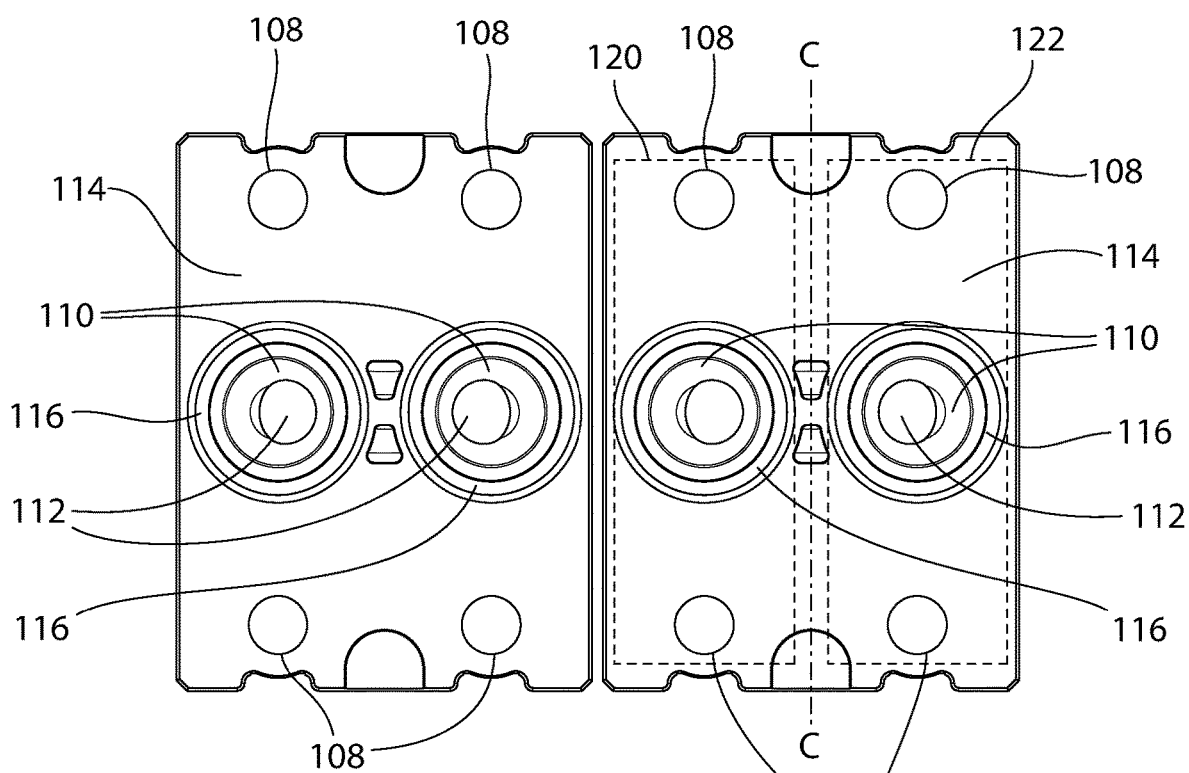
FIG. 4D is a top view of the substrate blocks of FIG. 4A.
Figure 5:
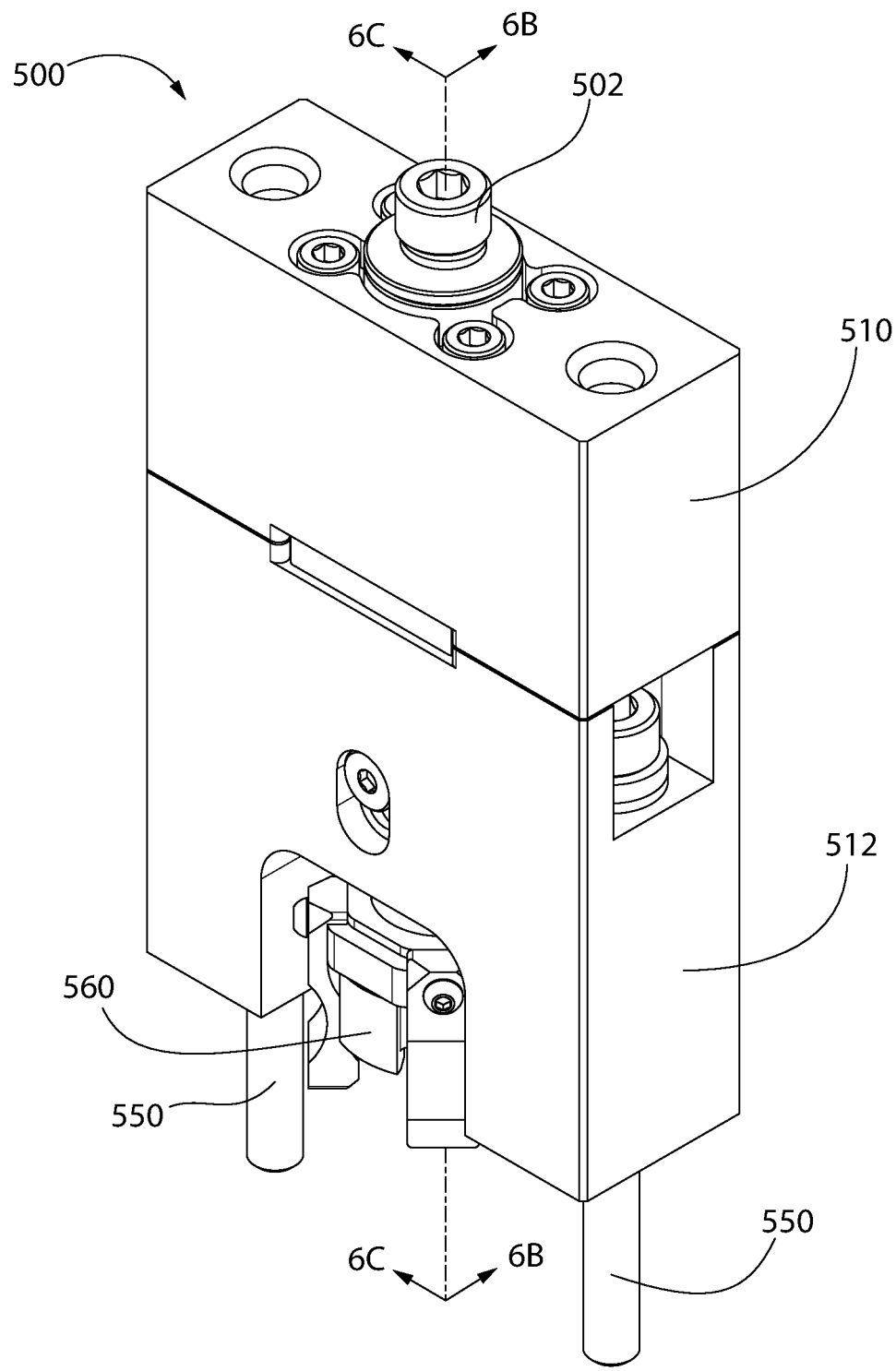
FIG. 5 is a perspective view of a seal insertion tool for installing a seal into a substrate block of an apparatus controlling flow.

As best shown in FIG. 4C, the fluid flow component 200 comprises a bottom surface 214 comprising two fluid ports 210, with one fluid port 210 being an inlet and the other being an outlet. A fluid flow path 212 extends from a fluid opening of one fluid port 210 to a fluid opening of the other fluid port 210. Similarly, in FIG. 4D, it can be seen that the substrate blocks 104 each comprise a first surface 114 comprising two fluid ports 110. A fluid flow path 112 extends from a fluid opening of one fluid port 110 to a fluid opening of the other fluid port 110. Returning to FIG. 4B, it can be seen that, when the seal 300 is installed between the fluid flow component 200 and the substrate block 104, there is a distance d between the first surface 114 and the bottom surface 214. Thus, the seal 300 is compressed between the fluid flow component 200 and the substrate block 104. The seal 300 fits into the annular groove 216 of the fluid flow component 200 and the annular groove 116 of the substrate block 104. During assembly, the first surface 114 and the bottom surface 214 are drawn closer together by the component fasteners 250, reducing the distance d between the first surface 114 and the bottom surface 214.

The substrate blocks 104 each comprise a central plane C-C which divides the first fluid port 110 from the second fluid port 110. The central plane C-C is spaced at a midpoint between two opposite sides of the substrate block 104 and is transverse to the first surface 114. The first surface 114 forms a footprint of the substrate block 104 onto which components may be mounted. However, due to the configuration of the fluid delivery module 1400, the substrate blocks 104 each mount two different components. The central plane C-C divides the footprint of the substrate block 104 into a first footprint half 120 and a second footprint half 122. A fluid flow component 200 is always mounted to one or the other of the first footprint halves 120, 122 and never crosses the central plane C-C.

Turning to FIGS. 5-8, a seal insertion tool 500 is shown. The seal insertion tool 500 is used to press a seal 300 into an annular groove 116 of a substrate block 104. As can be best seen in FIG. 5, the seal insertion tool 500 has an actuator 502, an end effector 560, an upper body 510, a lower body 512, and a pair of tool fasteners 550. The actuator 502 may be a socket head cap screw or other component which can be engaged by a tool such as an Allen wrench, socket, spanner wrench, or any other tool which can operate the actuator 502. The end effector 560 holds the seal and moves up and down to press the seal 300 into the annular groove 116 as will be discussed in greater detail below. The tool fasteners 550 fit into the fastener passageways 108 of the substrate block 104 and engage the same anchors that the component fasteners 250 engage. The tool fasteners 550 are preferably threaded, but they may operate in any manner required to secure the seal insertion tool 500 to the substrate block 104.

Figure 6A:
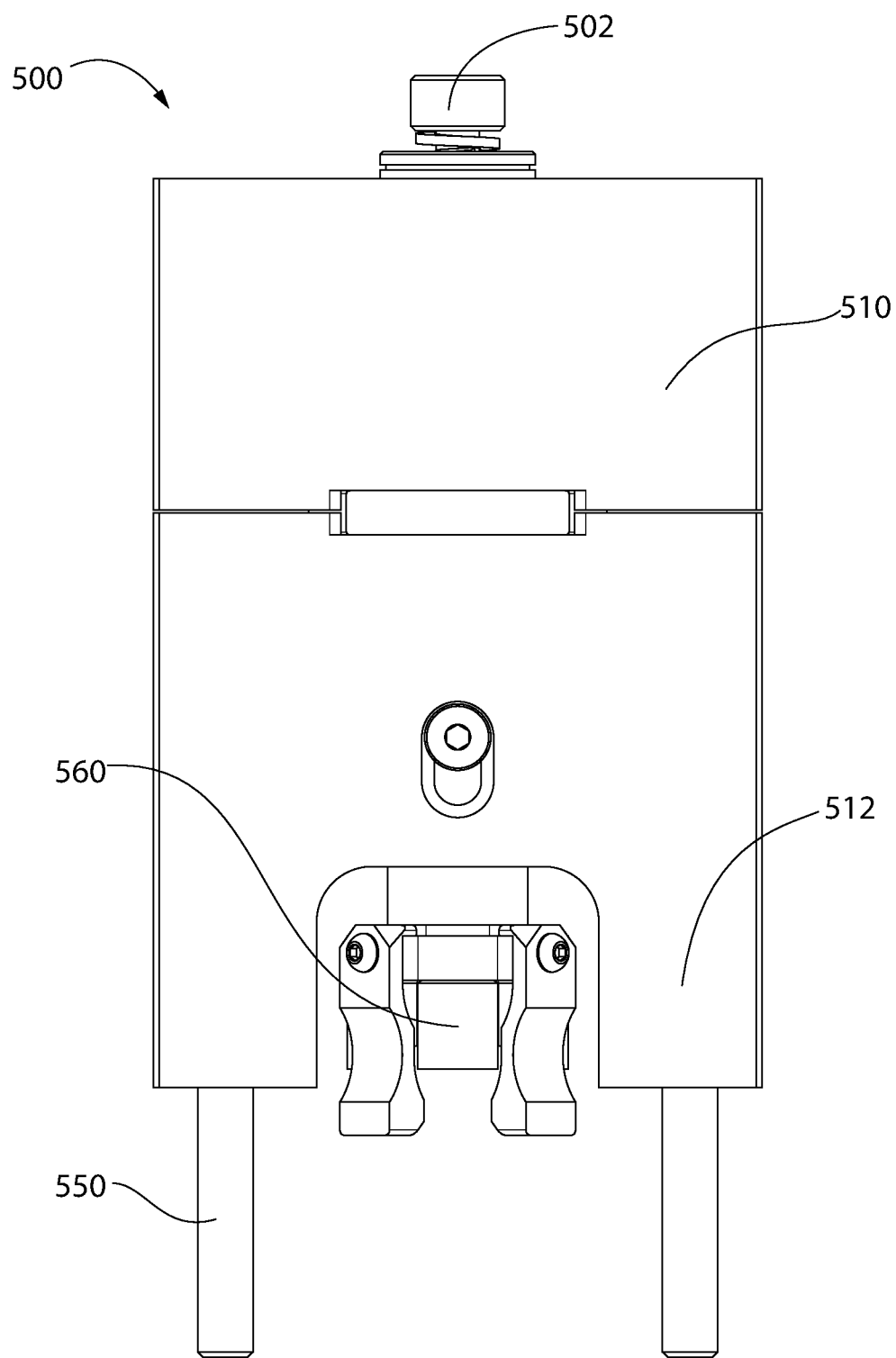
FIG. 6A is a front view of the seal insertion tool FIG. 5.
Figure 6B:
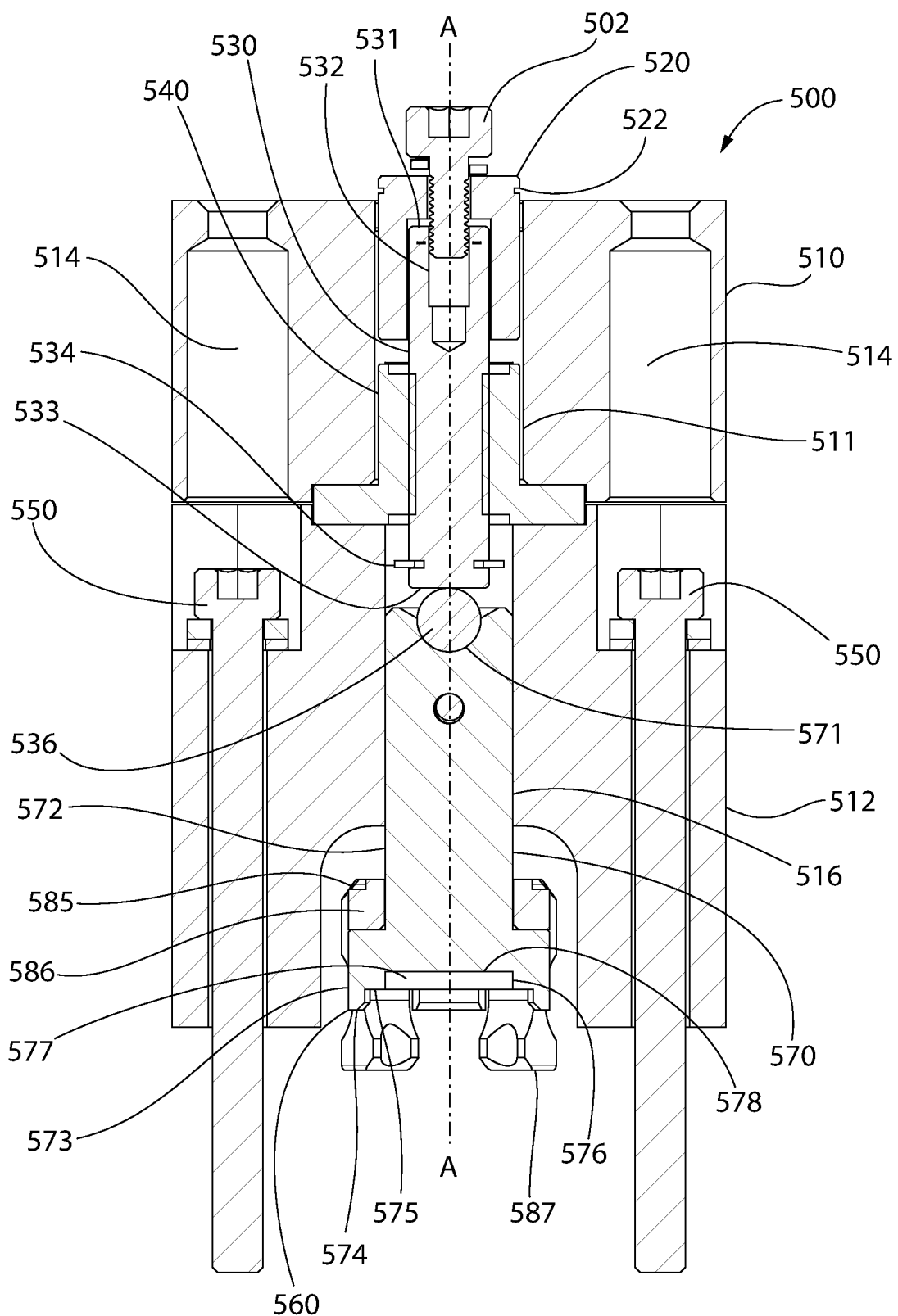
FIG. 6B is a cross-sectional view of the seal insertion tool FIG. 5 taken along the line 6B-6B.
Figure 6C:
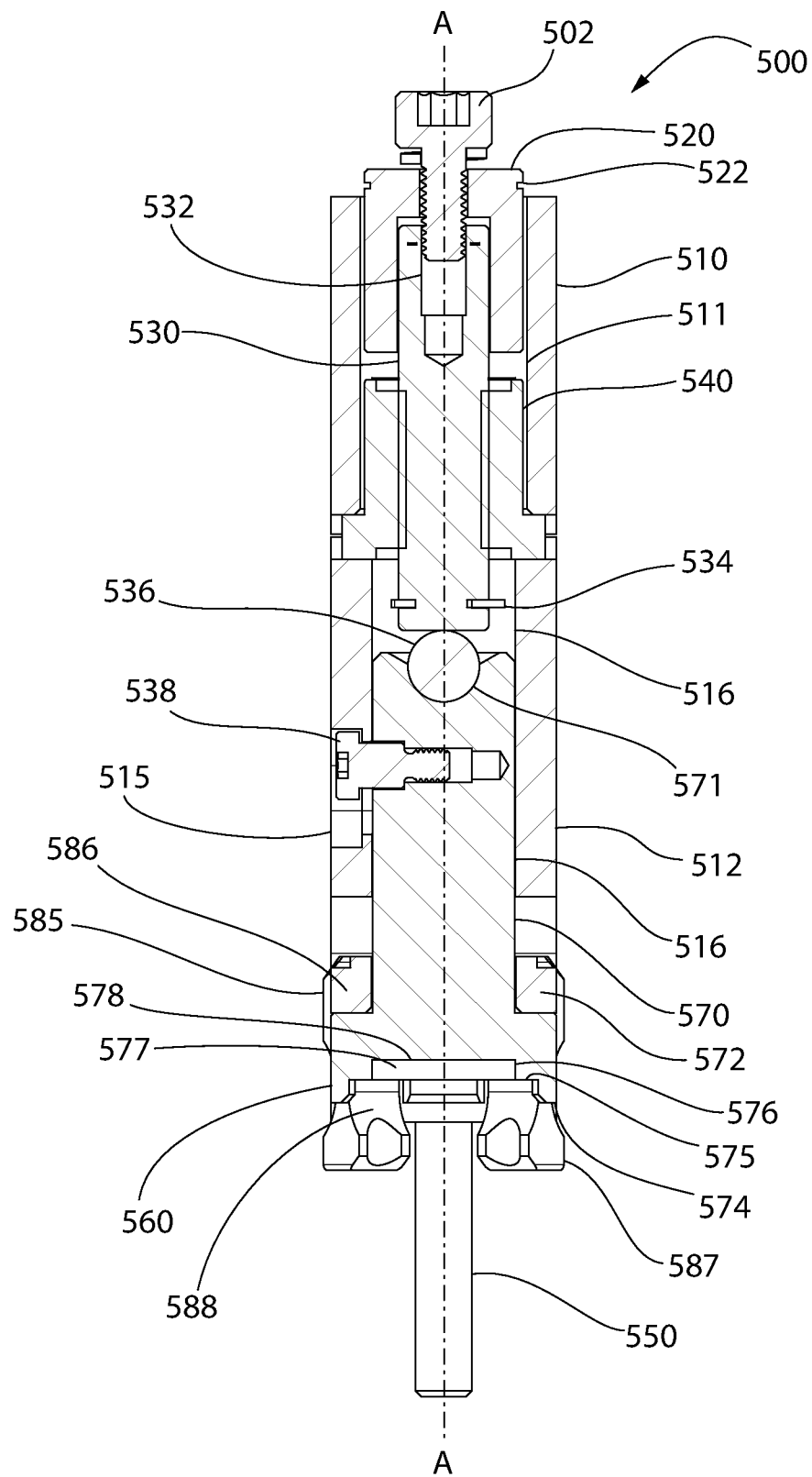
FIG. 6C is a cross-sectional view of the seal insertion tool FIG. 5 taken along the line 6C-6C.

Turning to FIGS. 6A-C, a front view and two cross sections of the seal insertion tool 500 are shown. The actuator 502 of the seal insertion tool 500 is fixedly attached to a drive shaft 530. The drive shaft 530 has a hole 532 which receives the actuator 502, fixing the drive shaft 530 to the actuator 502 by a threaded connection. Alternately, the actuator 502 may be glued, welded, pressed, or otherwise fixed to the drive shaft 530. In some embodiments, the actuator 502 may be integrally formed with the drive shaft 530. Preferably, the drive shaft 530 is a ball screw, but may also be a lead screw having an Acme or trapezoidal thread, a conventional screw, or any other shaft capable of linear motion when rotated. The drive shaft 530 extends from a proximal end 531 to a distal end 533, the hole 532 for the actuator 502 being located at the proximal end 531.

The drive shaft 530 threadedly engages a threaded collar 540. The threaded collar 540 is a ball nut in this implementation, but may be a lead nut having trapezoidal or Acme threads, or a conventional nut for triangular profile threads. Alternately, the threaded collar 540 may be any device capable of engaging the drive shaft 530 to provide relative motion between the drive shaft 530 and the threaded collar 540 when one of the drive shaft 530 and the threaded collar 540 are rotate with respect to the other one of the drive shaft 530 and the threaded collar 540.

An input stop block 520 is captured between the actuator 502 and the drive shaft 530. The input stop block 520 serves to limit travel of the drive shaft 530 by bottoming out on the threaded collar 540. This prevents excessive compression of the seal 300 during installation and minimizes the risk of destruction of the anchors in the substrate panel 1402 due to excessive force from the drive shaft 530 overwhelming the maximum retention force of the actuators. The input stop block 520 also rides in the bore 511 of the upper body 510, reducing bending forces on the drive shaft 530 when torque is applied to the actuator 502. Finally, the input stop block 520 has an indicator groove 522, which may be used to indicate when the drive shaft 530 has been adequately retracted prior to installation of the seal 300.

At the distal end 533 of the drive shaft 530, a snap ring 534 fits within an annular groove of the drive shaft 530. The snap ring 534, also known as a circlip, e-clip, or spring clip, fits into the annular groove and prevents excessive retraction of the drive shaft 530. When the actuator 502 is turned to retract the drive shaft 530 upward, the snap ring 534 engages the threaded collar 540 and prevents further rotation of the actuator 502. This beneficially ensures that the drive shaft 530 is not excessively retracted from the threaded collar 540 and prevents undesired disassembly of the seal insertion tool 500.

The distal end 533 of the drive shaft 530 engages a friction reducing component 536. In this case, the friction reducing component 536 is a ball bearing, but it may also be a thrust washer or other friction reducing component. The friction reducing component 536 engages an end effector 560. The end effector 560 has a plunger 570 and a gripper 585. The plunger 570 has a depression 571 into which the friction reducing component 536 rests.

The plunger 570 also has a plunger shaft 572 and a plunger head 573. The plunger shaft 572 slides in a bore 516 formed in the lower body 512. The plunger head 573 has an end face 574, a work surface 575, an annular wall 576, a depression 577, and a floor 578. The end face 574 is the lower-most surface of the plunger head 573 as shown in FIGS. 6A-C. The work surface 575 is a planar surface which is above and inside of the end face 574. The work surface 575 surrounds the depression 577, which is bounded by the annular wall 576 and the floor 578. When a seal 300 is loaded into the end effector 560, the top surface 312 of the outer upstanding ring wall 306 of the seal 300 rests against the work surface 575 while a top surface 314 of the inner upstanding ring wall 308 is spaced from the floor 578. In this manner, the inner upstanding ring wall 308 is not deformed during installation.

The gripper 585 has a collar 586 and a plurality of grip fingers 587. The collar 586 is sized so that it slides on the plunger shaft 586. The grip fingers 587 are attached to the plunger shaft 586 so that they move with the collar 586. A longitudinal axis A-A extends through the actuator 502, the drive shaft 530, the friction reducing component 536, and the plunger 570. The plunger 570 and the gripper 585 are constrained so that they move along the longitudinal axis A-A during installation of the seal. During use, the gripper 585 retains the seal 300. The gripper 585 is designed to capture the seal 300 so that the seal 300 is retained while the seal insertion tool 500 is installed onto the substrate block 104. The grip fingers 587 each have inner surfaces 588 which have arcuate sections and flat sections that engage the cylindrical outer surface 304 and the outer upstanding ring wall 306 of the seal 300 as will be discussed in greater detail below.

Rotation of the end effector 560 is prevented by an anti-rotation feature 538 which is installed within a slot 515 formed in the lower body 512. The anti-rotation feature 538 may slide up and down in the slot 515, but the end effector 560 cannot rotate. The anti-rotation feature 538 engages the plunger shaft 572 of the plunger 570 to prevent rotation. Optionally, the anti-rotation feature 538 may be a bolt that is installed in a threaded hole in the plunger 570. In other embodiments, it may be a pin or other feature which is pressed, welded, glued, or otherwise installed in place.

The combination of the anti-rotation feature 538 and the slot 515 also serve to prevent undesired removal of the end effector 560. The end effector 560 is not axially constrained against the drive shaft 530. Instead, the end effector 560 is free to float axially. When the drive shaft 530 is retracted and no upward force is present on the end effector 560, there may be a space between the friction reducing component 536 and the drive shaft 530. However, as soon as a force is applied to the end effector 560 and the drive shaft 530 is advanced into contact with the friction reducing component 536, the friction reducing component 536 transmits the force from the drive shaft 530 to the end effector 560.

Figure 7:
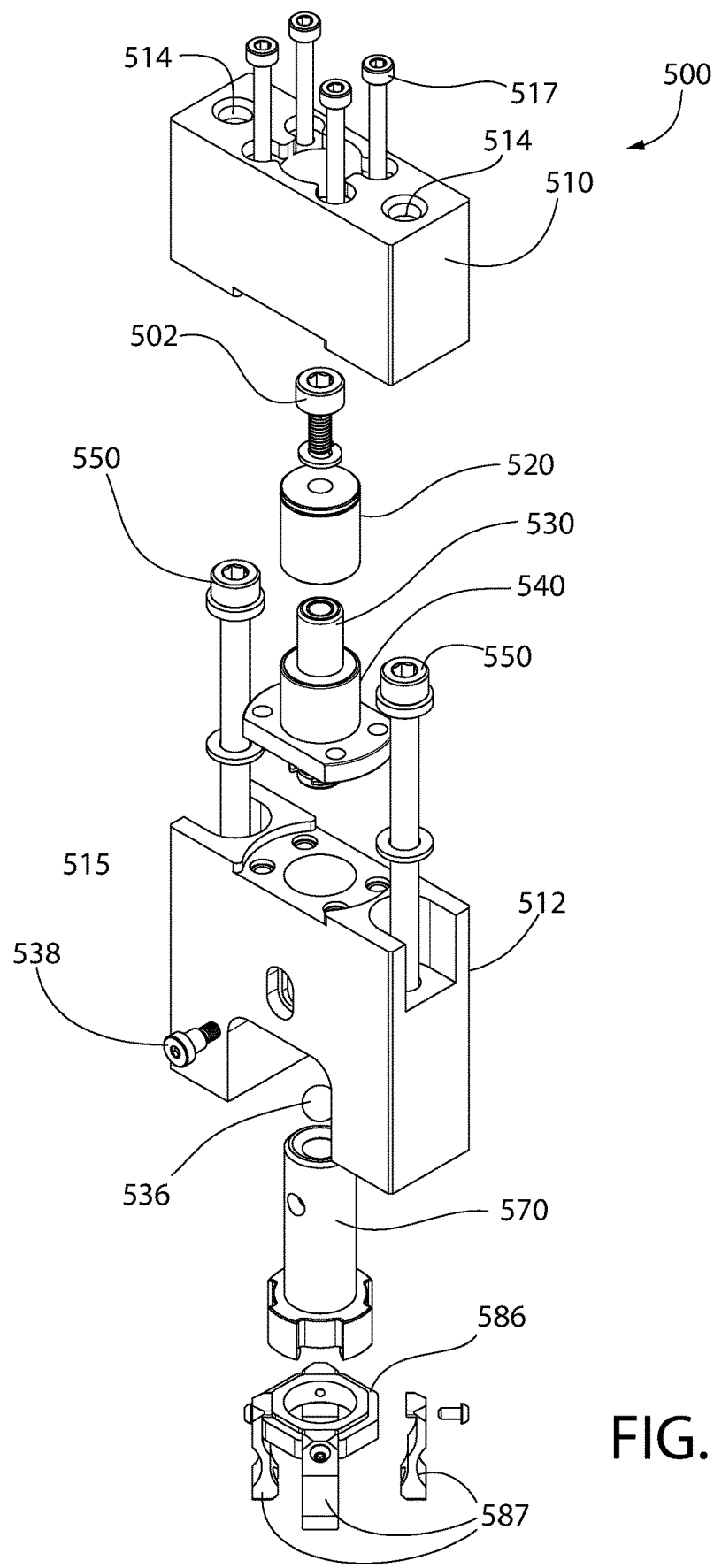
FIG. 7 is an exploded view of the seal insertion tool of FIG. 5.

Turning to FIG. 7, an exploded view of the seal insertion tool 500 is shown. The components described are shown. As can be best seen in this view, an additional set of fasteners 517 are used to attach the upper body 510 to the lower body 512. The threaded collar 540 is captured by the fasteners 517 because the threaded collar 540 is sandwiched between the upper body 510 and the lower body 512. The upper body 510 also has a plurality of passageways 514 which allow a tool to be inserted through the upper body 510 to reach the fasteners 550. The fasteners 550 are also captured by the features of the passageways 514 but are free to retract axially. This beneficially facilitates installation of the seal insertion tool 500 onto a substrate block 104.

Figure 8:
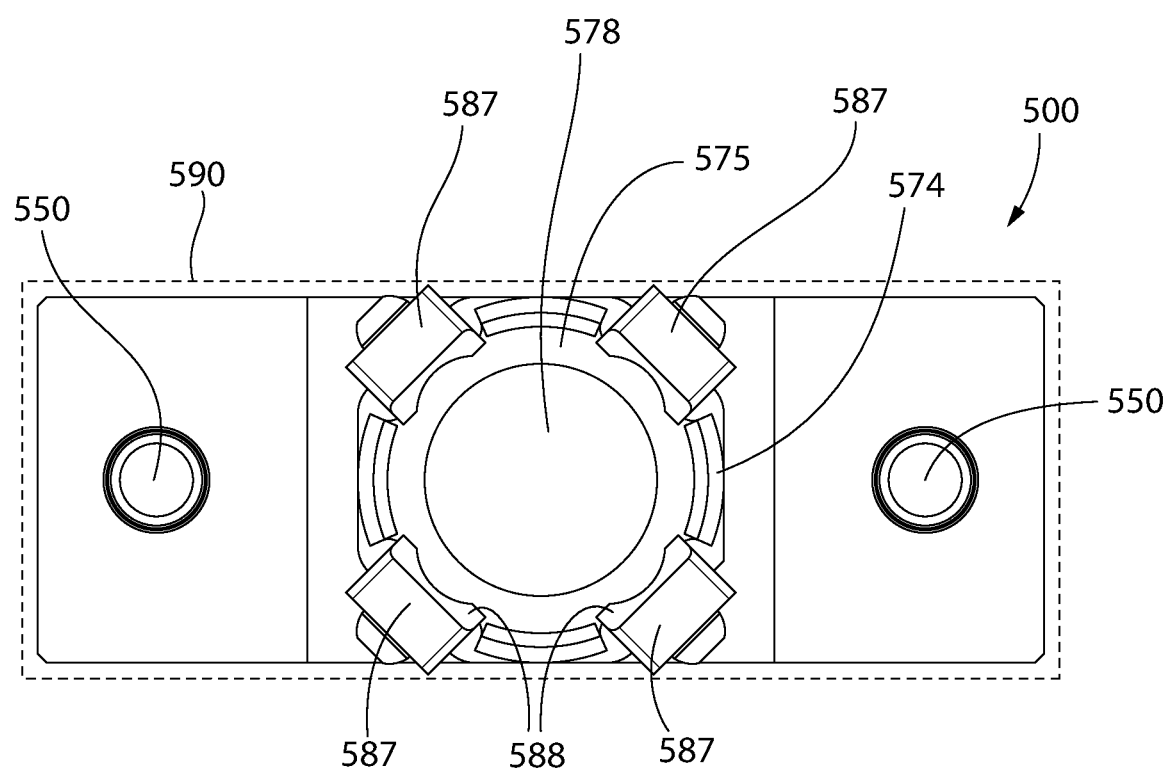
FIG. 8 is a bottom view of the seal insertion tool of FIG. 5.

Turning to FIG. 8, a bottom view of the seal insertion tool 500 is shown. The seal insertion tool 500 has a footprint 590 as shown by the dotted line. This is the area that it occupies on the substrate block 104 when the seal insertion tool 500 is installed on the substrate block 104. The footprint 590 is less than half of the footprint of the substrate block 104. Thus, the seal insertion tool 500 fits within either one of the first and second footprint halves 120, 122 and does not cross the central plane C-C. The footprint 590 is smaller than each of the first and second footprint halves 120, 122 to ensure that the seal insertion tool 500 does not interfere with the fluid flow components 200 in the fluid delivery module 1400.

Figure 9:
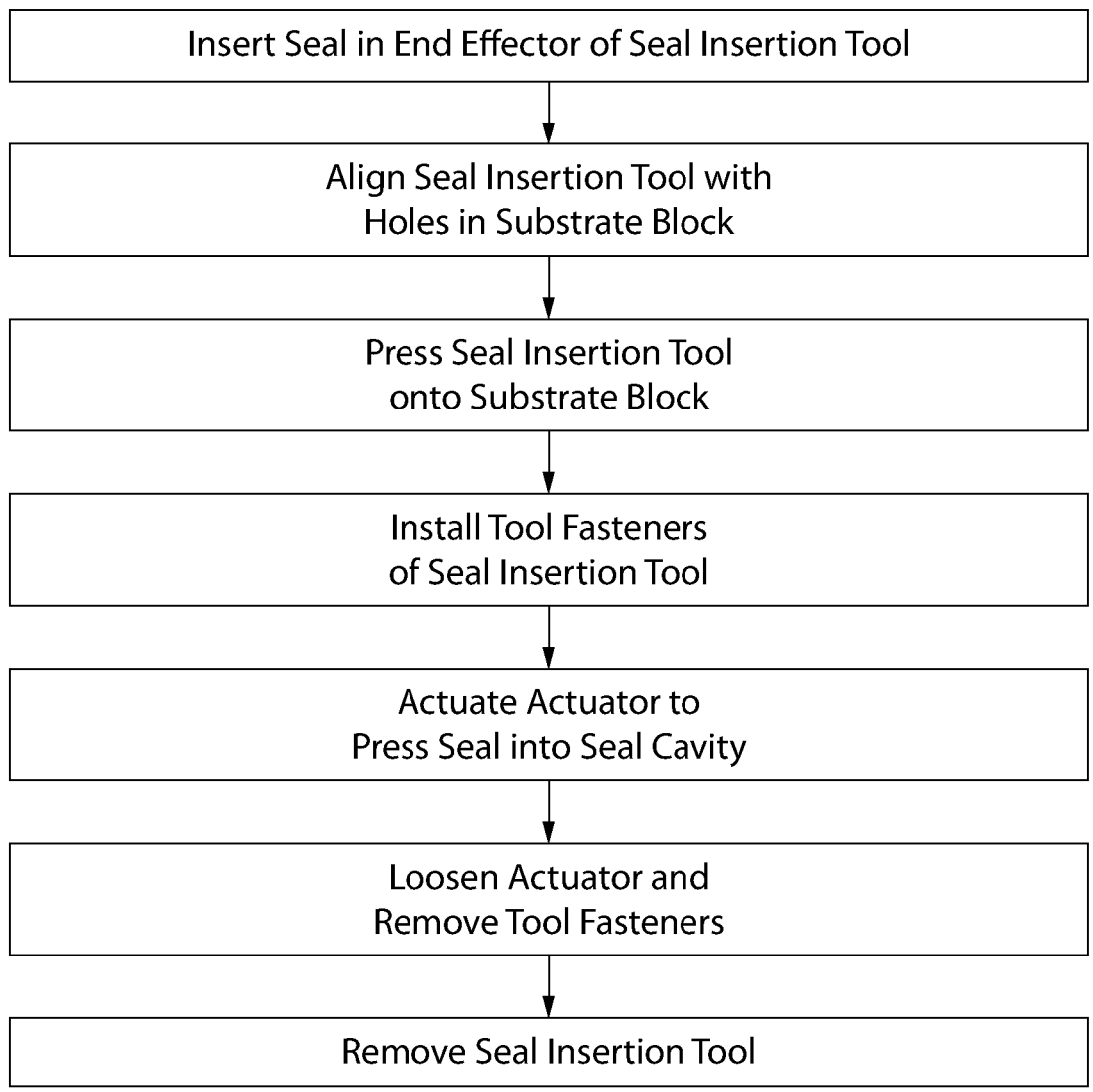
FIG. 9 is a flow chart showing a method of installing a seal.

Turning to FIG. 9, a method of using the seal insertion tool 500 is described in greater detail. First, the user inserts a seal 300 in the end effector 560. This is done by pushing the gripper 585 into a lowered position where the collar 586 rests against the plunger head 573 of the plunger 570. The seal 300 is then pressed into position in the end effector 560 so that the top surface 312 of the outer upstanding ring wall 308 is in contact with the work surface 575 of the plunger 570. The gripper 585 remains in the lowered position with the gripping fingers 587 engaging the outer upstanding ring wall 308 and holding the seal 300 firmly in place. Either before or after installing the seal, the actuator 502 is rotated so that the drive shaft 530 is fully retracted, and the indicator groove 522 is exposed above a top surface of the upper body 510. This ensures that there is sufficient clearance for the seal during the installation of the seal insertion tool 500 onto the substrate block 104.

Second, the seal insertion tool 500 is aligned with the substrate block 104 so that the fasteners 550 can be inserted through the fastener passageways 108. Third, the seal insertion tool 500 is pressed onto the substrate block 104. The gripping fingers 587 are the first part of the seal insertion tool 500 to contact the first surface of the substrate block 104. The tool fasteners 550 are within the fastener passageways 108 but are not secured to the underlying anchors.

Fourth, the tool fasteners 550 are installed into the anchors to secure the seal insertion tool 500 to the substrate block 104. The installation of the tool fasteners 550 causes the bottom of the seal insertion tool 500 to contact the first surface 114 of the substrate block 104. This also pushes the gripper 585 into a raised position where the collar 586 of the gripper 585 is spaced from the plunger head 573 of the plunger 570. When transitioning from the lowered position to the raised position, the gripping fingers 587 slide past the seal 300, with the inner surface 588 of the gripping fingers 587 engaging the cylindrical outer surface 304 of the seal 300. The gripping fingers 587 deflect outward, maintaining pressure on the seal 300 as the plunger 570 moves downward relative to the first surface 114 of the substrate block 104.

Fifth, the actuator 502 is actuated by rotation to lower the lower portion 318 of the annular seal 300 into the annular groove 116 of the fluid port 110. The actuator 502 transitions from its initial raised state where the actuator 502 and the end effector 560 are retracted to a lowered state where the actuator 502 and the end effector 560 are extended. As the end effector 560 is transitioned to the lowered state, the seal 300 is pressed into the annular groove 116 by engagement between the work surface 575 and the top surface 312 of the upstanding ring wall 306. In the process, the inner surface 588 of the gripping fingers 587 engage the plunger head 573 and engage further via cam action, allowing the seal to be released as the actuator 502 is actuated to insert the seal 300 into the annular groove 116. Sixth, the actuator 502 is loosened and the tool fasteners 550 are removed. Finally, the seal insertion tool 500 is removed from the substrate mounting block 104.

Figure 10A:
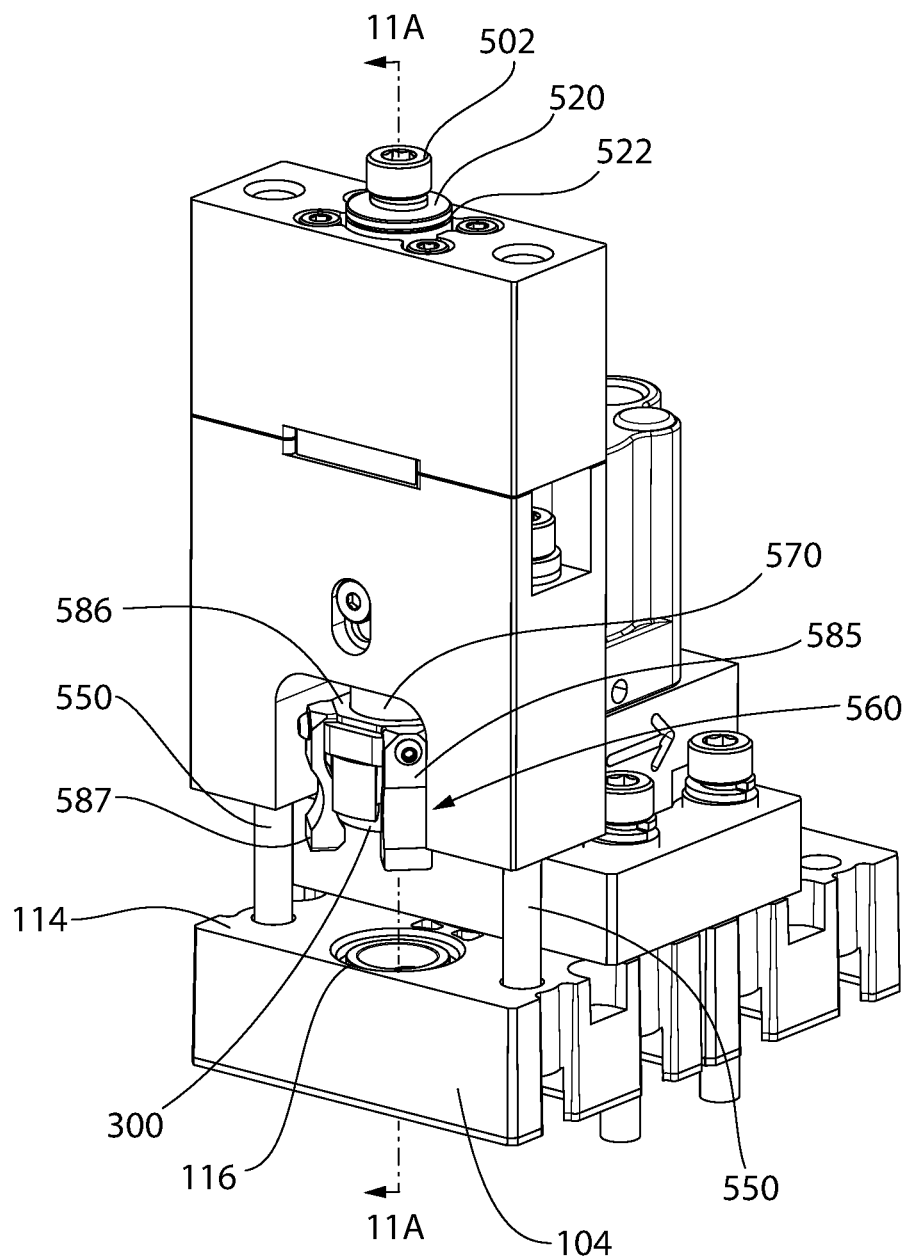
FIG. 10A is a perspective view of a seal insertion tool and seal positioned above a substrate block of a portion of the fluid delivery module.

FIGS. 10A-11D show the use of the seal insertion tool 500 in greater detail. In FIGS. 10A and 11A, seal insertion tool 500 is positioned above the substrate block 104 with a seal 300 inserted into the end effector 560. The tool fasteners 550 are inserted into the fastener passageways 108 of the substrate block in preparation for installation of the seal insertion tool. It is also important to note that the actuator 502 is retracted so that the seal is not pressed into the annular groove 116 prior to fastening of the tool fasteners 550. This is indicated to a user by the indicator groove 522 of the input stop block 520 being exposed as shown. As can be seen, the inner surface 588 of the gripping fingers 587 engage an edge of the upstanding ring wall 306 of the seal 300. The gripper 585 is in the lowered position with the collar 586 touching the plunger head 573.

Figure 10B:
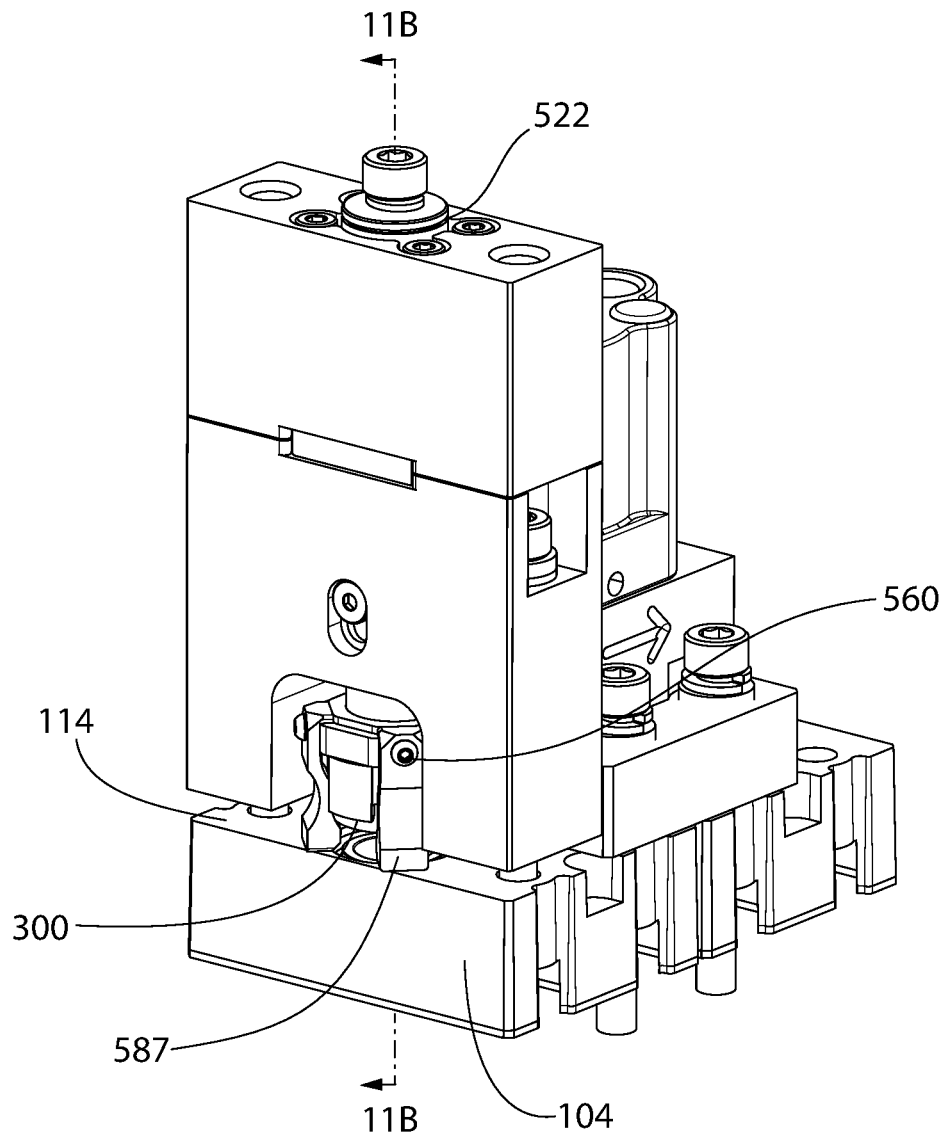
FIG. 10B is a perspective view of the end effector of the seal insertion tool positioned in contact with the substrate block of the portion of the fluid delivery module.
Figure 11A:
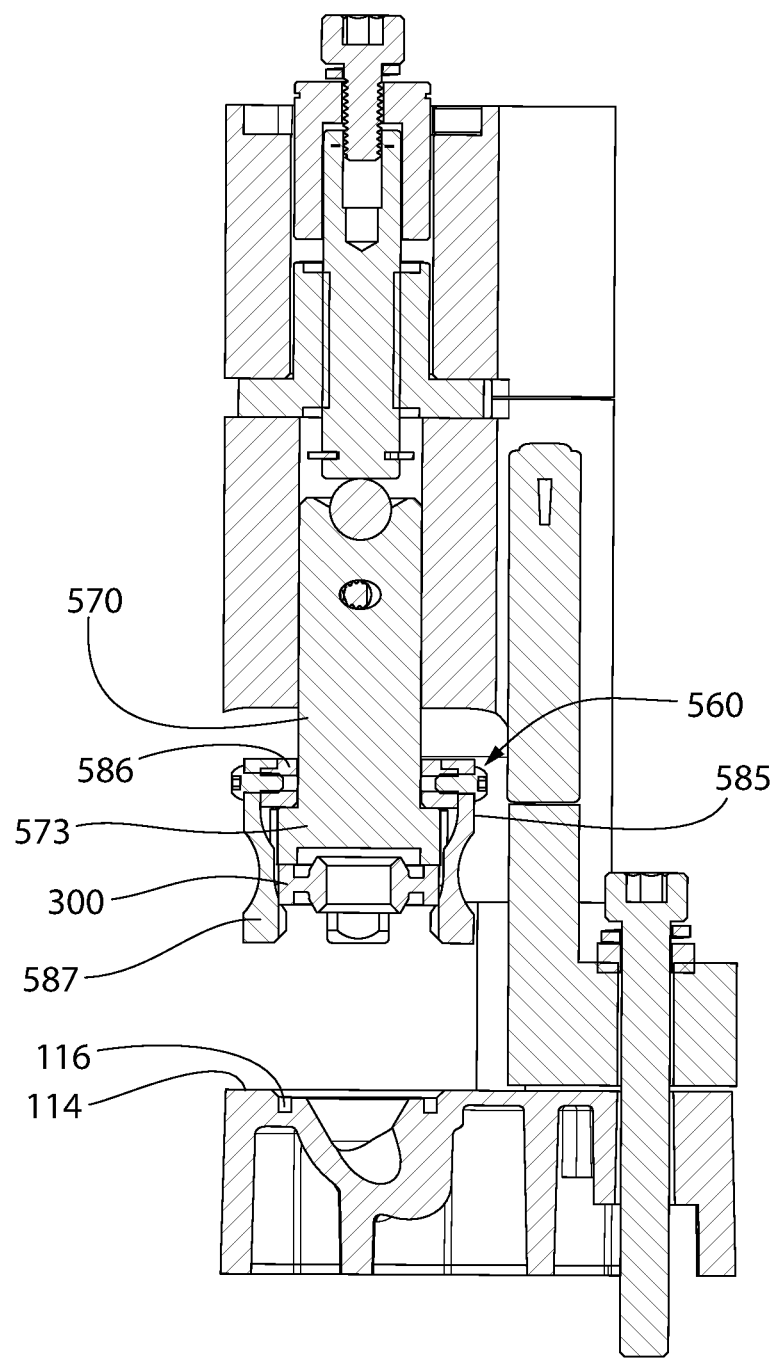
FIG. 11A is a cross-sectional view of the seal insertion tool, seal, and portion of the fluid delivery module of FIG. 10A, taken along line 11A-11A.
Figure 11B:
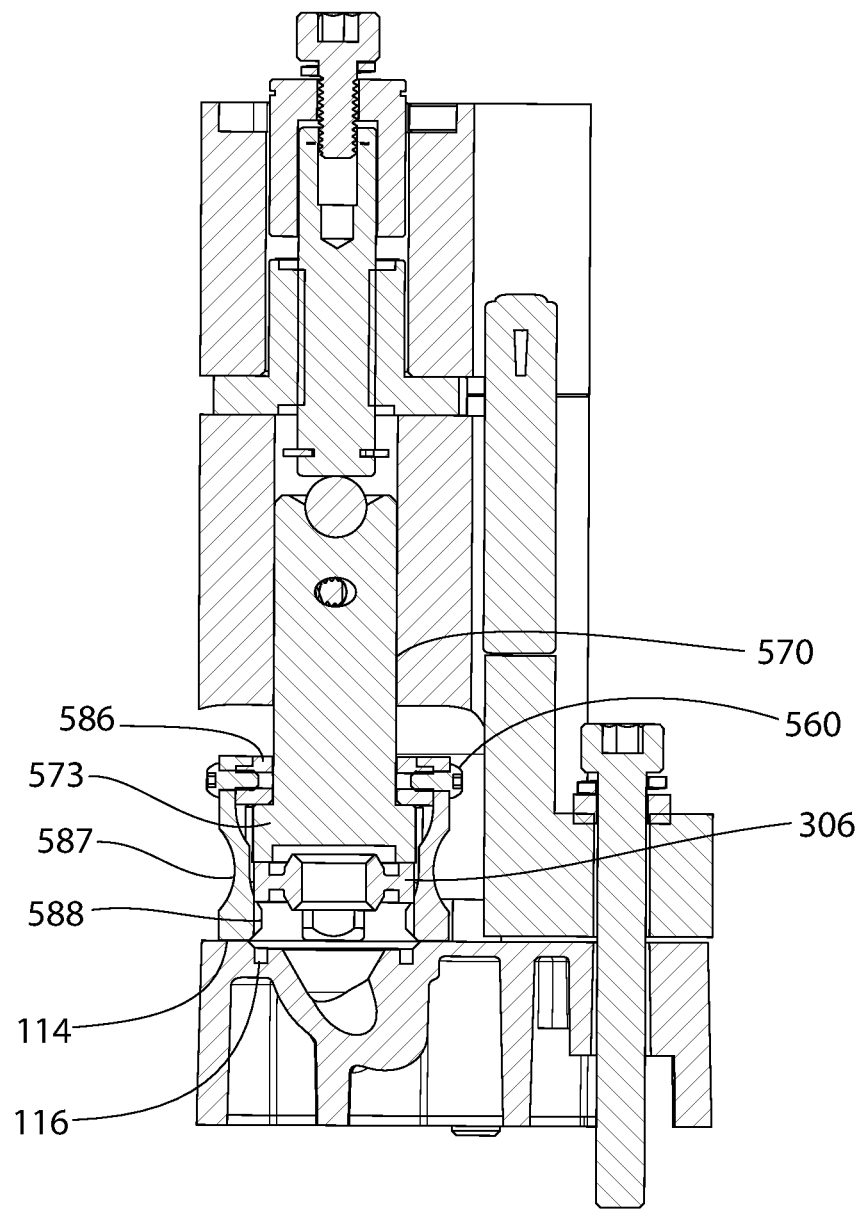
FIG. 11B is a cross-sectional view of the seal insertion tool, seal, and portion of the fluid delivery module of FIG. 10B, taken along line 11B-11B.

In FIGS. 10B and 11B, the seal insertion tool 500 is shown positioned atop the substrate block 104. The gripping fingers 587 are now in contact with the first surface 114 of the substrate block. The gripper 585 remains in the lowered position with the collar 586 touching the plunger head 573. The inner surface 588 of the gripping fingers 587 engage an edge of the upstanding ring wall 306 of the seal 300.

Figure 10C:
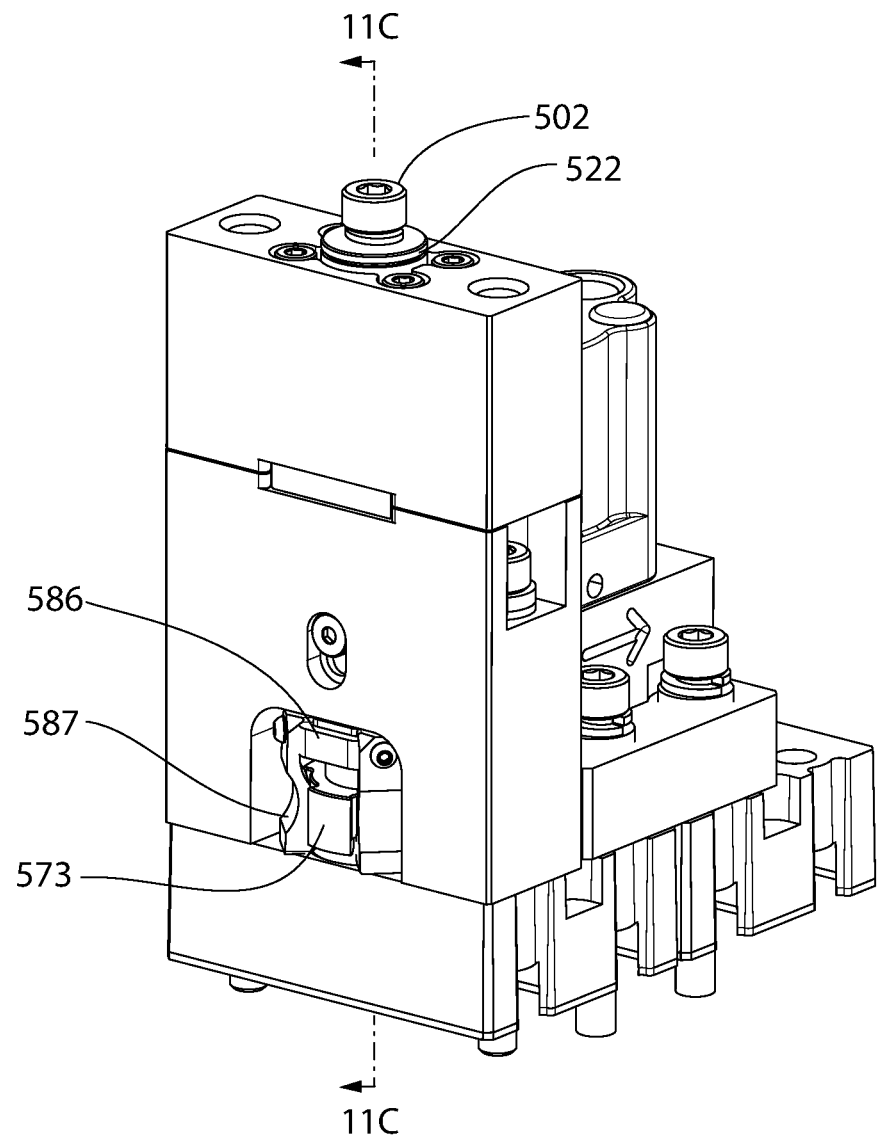
FIG. 10C is a perspective view of the seal insertion tool coupled to the substrate block of the portion of the fluid delivery module.
Figure 11C:
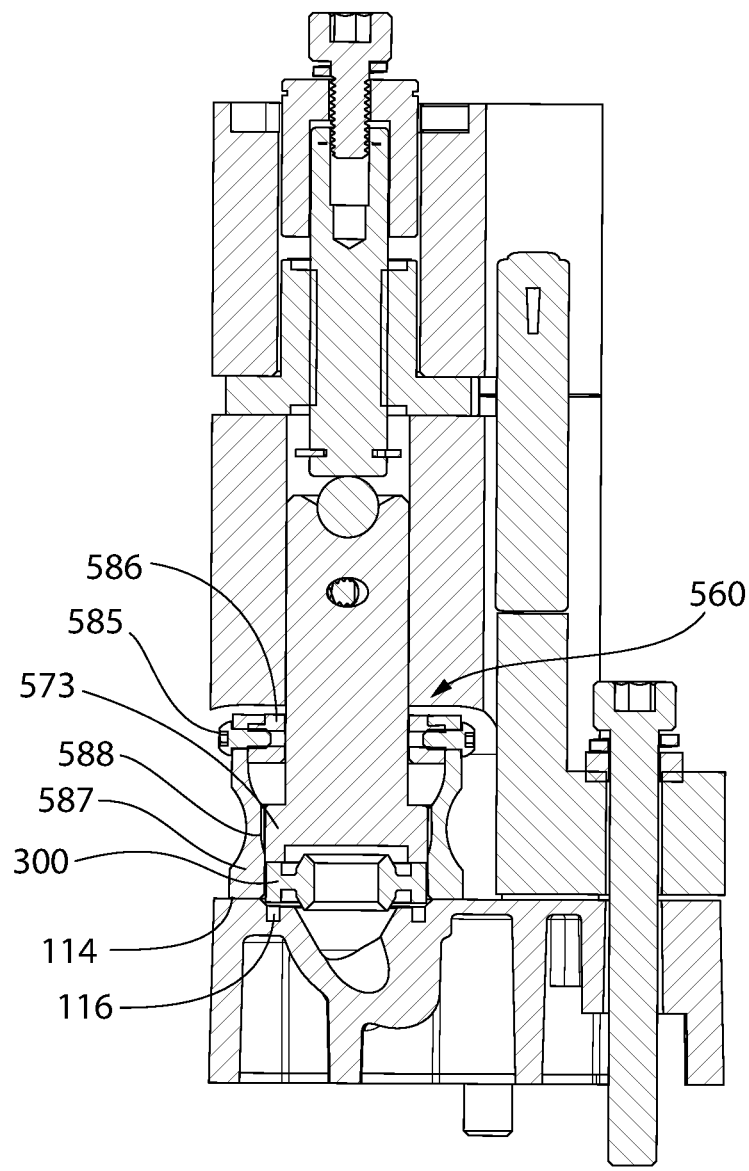
FIG. 11C is a cross-sectional view of the seal insertion tool, seal, and portion of the fluid delivery module of FIG. 10C, taken along line 11C-11C.

In FIGS. 10C and 11C, the seal insertion tool 500 is shown mounted to the first surface 114 of the substrate block 104. The tool fasteners 550 have been installed, securing the insertion tool 500 to the substrate block 104. The gripping fingers 587 remain in contact with the first surface 114 of the substrate block. The gripper 585 is now in a partially raised position because the tool fasteners 550 have pulled the seal insertion tool 500 against the first surface 114 of the substrate block 104. The collar 586 is no longer touching the plunger head 573. The collar 586 has moved up plunger shaft 572 because the gripper 585 has remained stationary as the seal insertion tool 500 has been mounted to the substrate block 104, causing the plunger 570 to translate downward toward the substrate block 104. The inner surface 588 of the gripping fingers 587 now engage the cylindrical outer surface 304 of the seal 300.

Figure 10D:
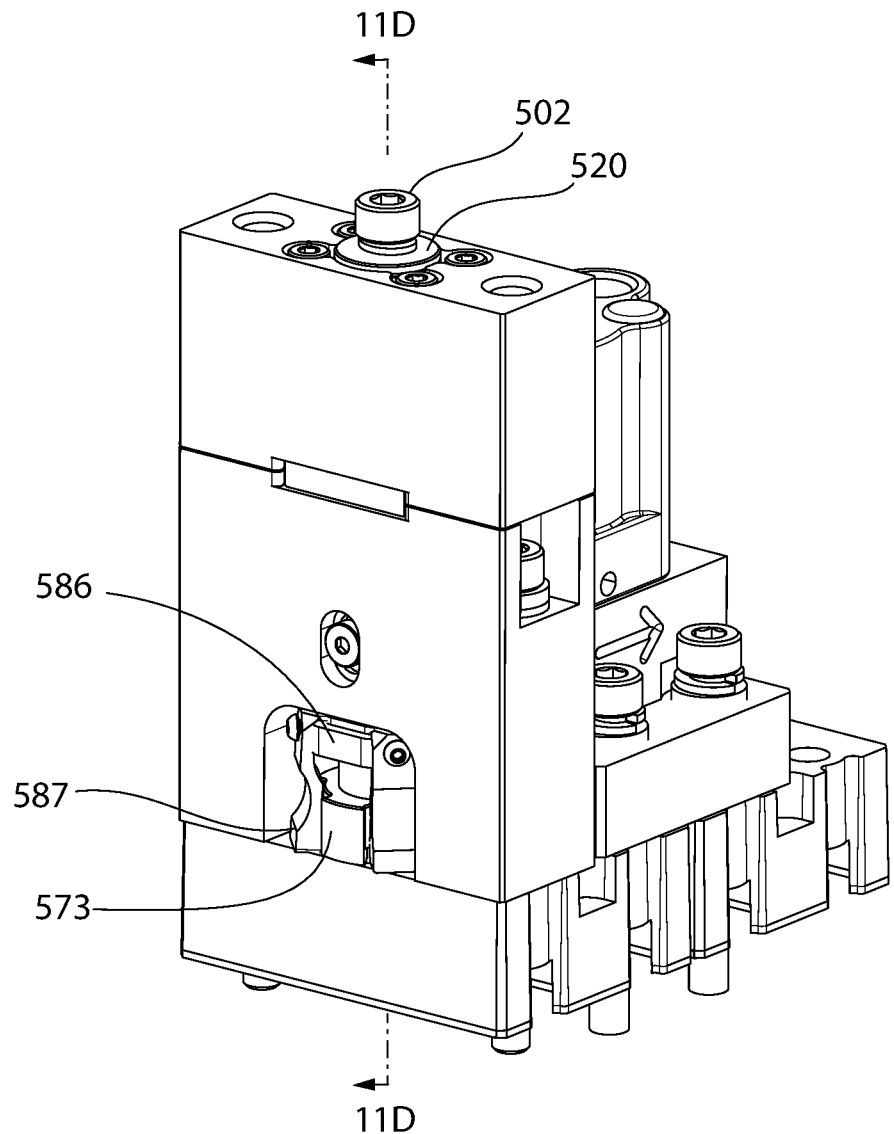
FIG. 10D is a perspective view of the seal pressed into the seal cavity of the substrate block of the portion of the fluid delivery module.
Figure 10E:
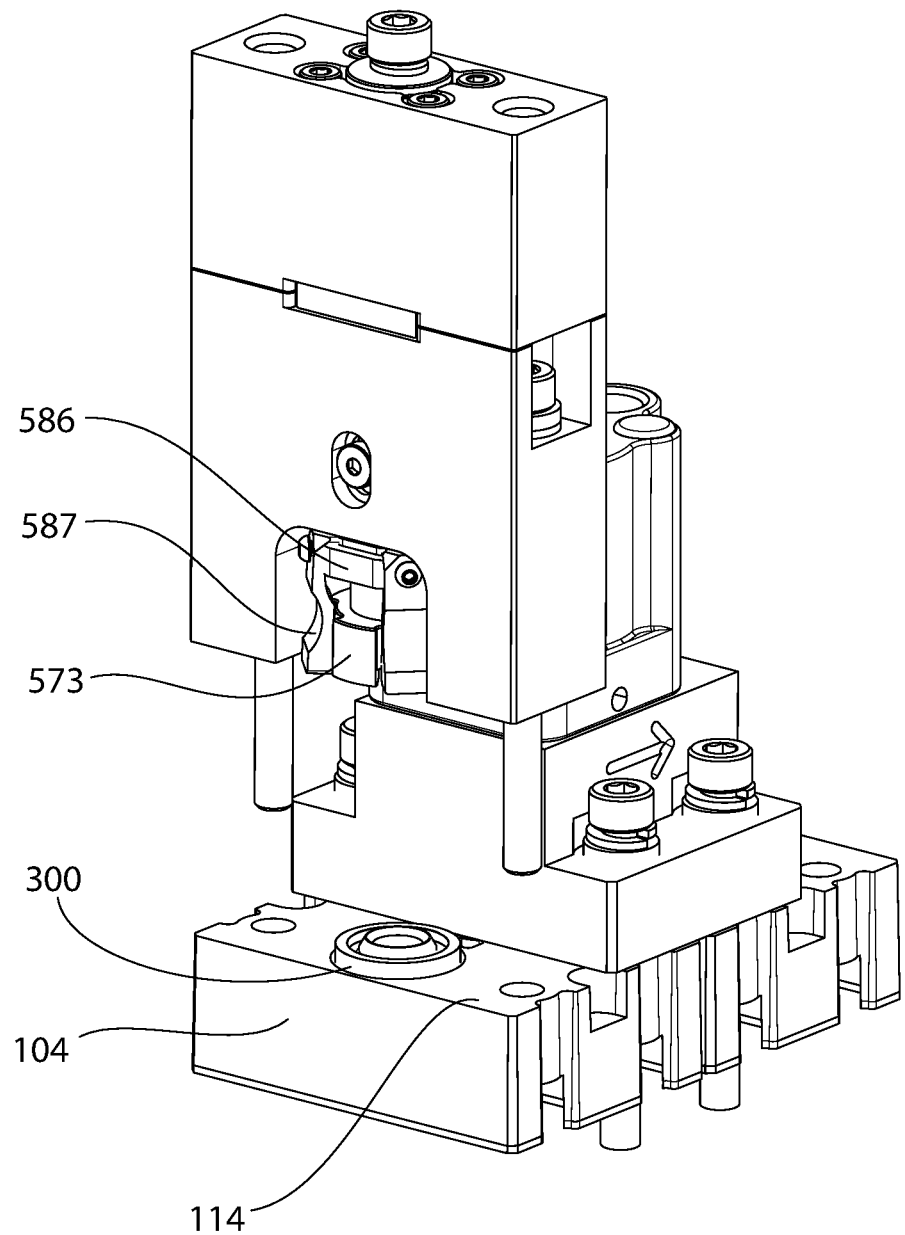
FIG. 10E is a perspective view of the seal insertion tool removed from the substrate block of the portion of the fluid delivery module.
Figure 11D:
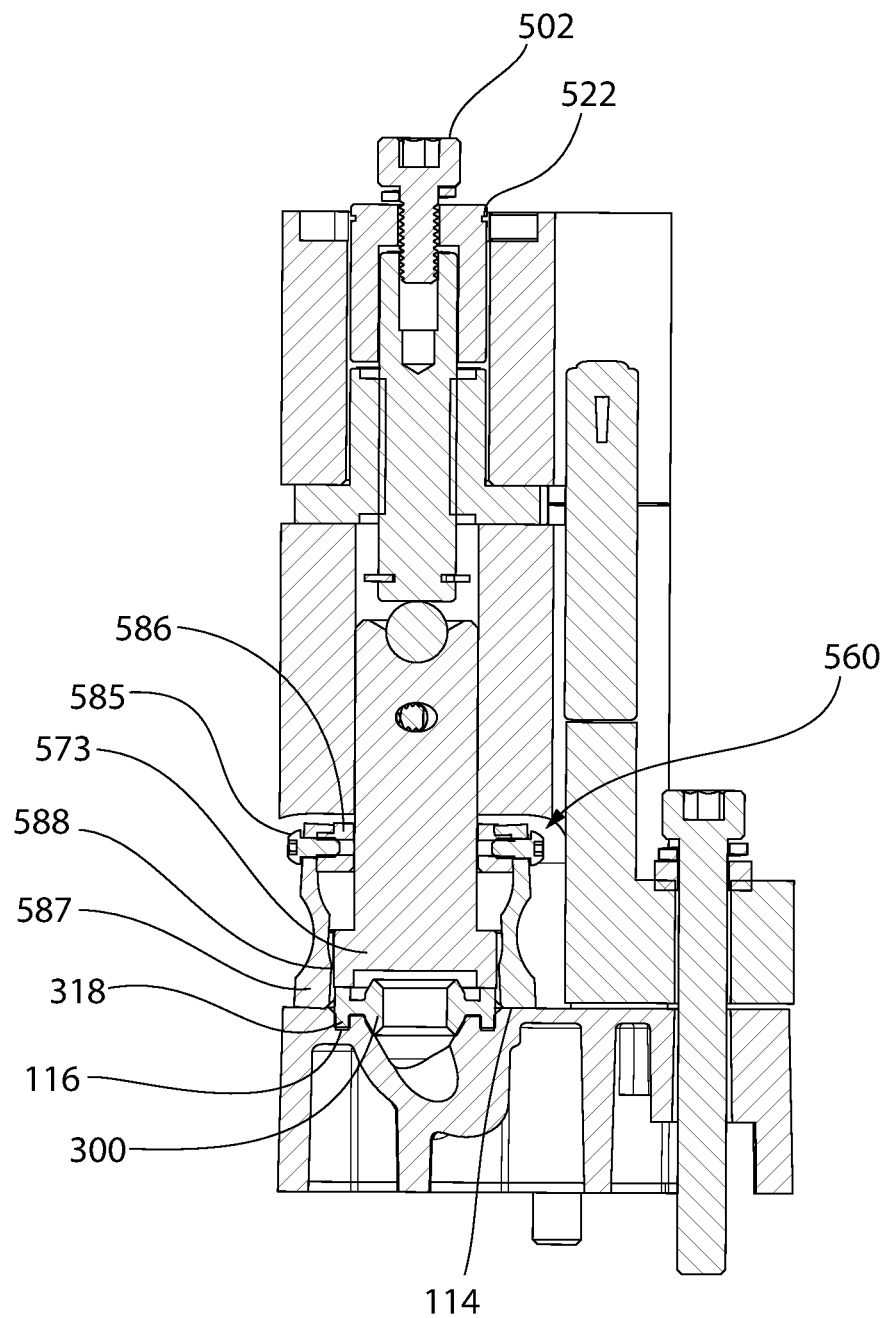
FIG. 11D is a cross-sectional view of the seal insertion tool, seal, and portion of the fluid delivery module of FIG. 10D, taken along line 11D-11D.

In FIGS. 10D and 11D, the actuator 502 of the seal insertion tool 500 is fully actuated to press the seal 300 into position in the substrate block 104. Specifically, the end effector 560 is translated to the lowered state from a raised state. In the lowered state, the indicator groove 522 of the input stop block 520 is no longer visible. The lower portion 318 of the seal 300 is pressed into the annular groove 116 and the gripper 585 has now fully transitioned to the raised state. In the raised state the gripping fingers 587 no longer engage the seal 300. Instead, the inner surface 588 of the gripping fingers 587 engage the plunger head 573 as shown. This avoids the seal 300 being retracted with the plunger 570 and ensures that the seal 300 remains in place. FIG. 10E shows the seal retainer 500 after the actuator 502 has been retracted and the tool fasteners 500 have been removed from their respective anchors. The seal 300 remains in the substrate block 104, ready for installation.

Prior to installation of a seal 300 with the seal insertion tool 500, it is important to remove any expired seals 300 and carefully clean the annular groove 116 and the first surface 114. As is apparent, this is done after removal of the fluid flow component 200 which is in need of servicing. For instance, a typical service procedure would be to remove a fluid flow component 200, remove the expired seal 300, clean the substrate block 104 thoroughly to prepare for installation of a new seal 300, install the seal 300 as discussed above, and then reinstall the fluid flow component 200.

Figure 12A:
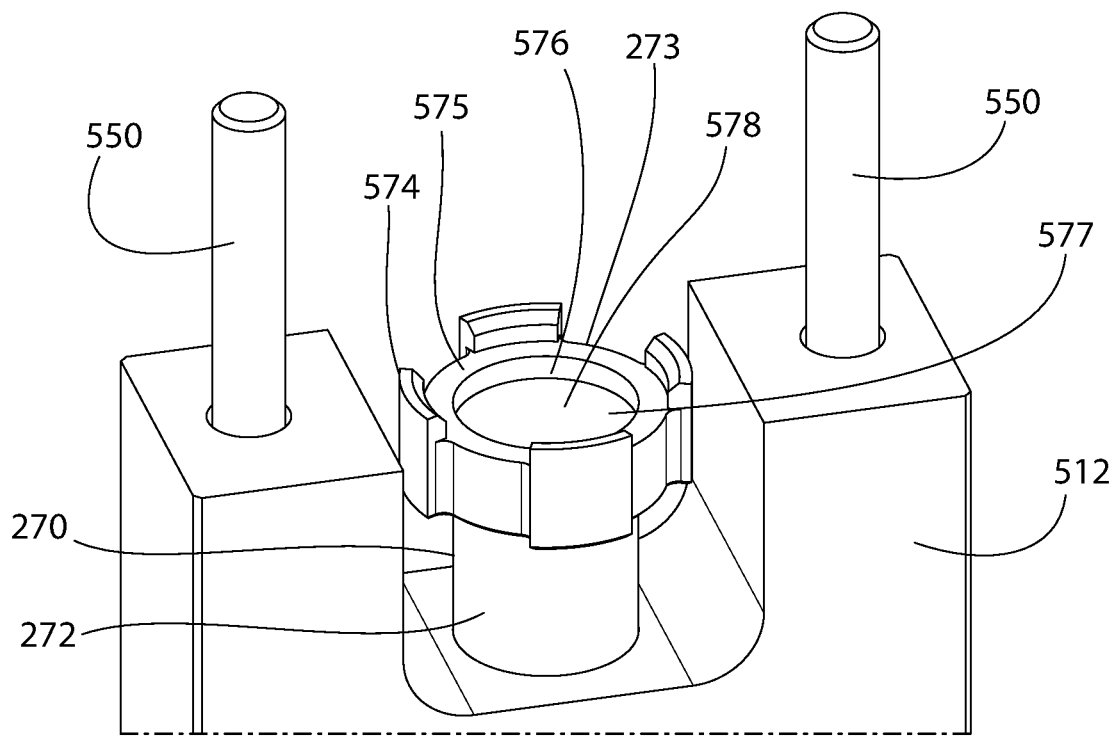
FIG. 12A is a perspective view of a portion of the seal insertion tool of FIG. 5 showing the end effector with the grippers removed.
Figure 12B:
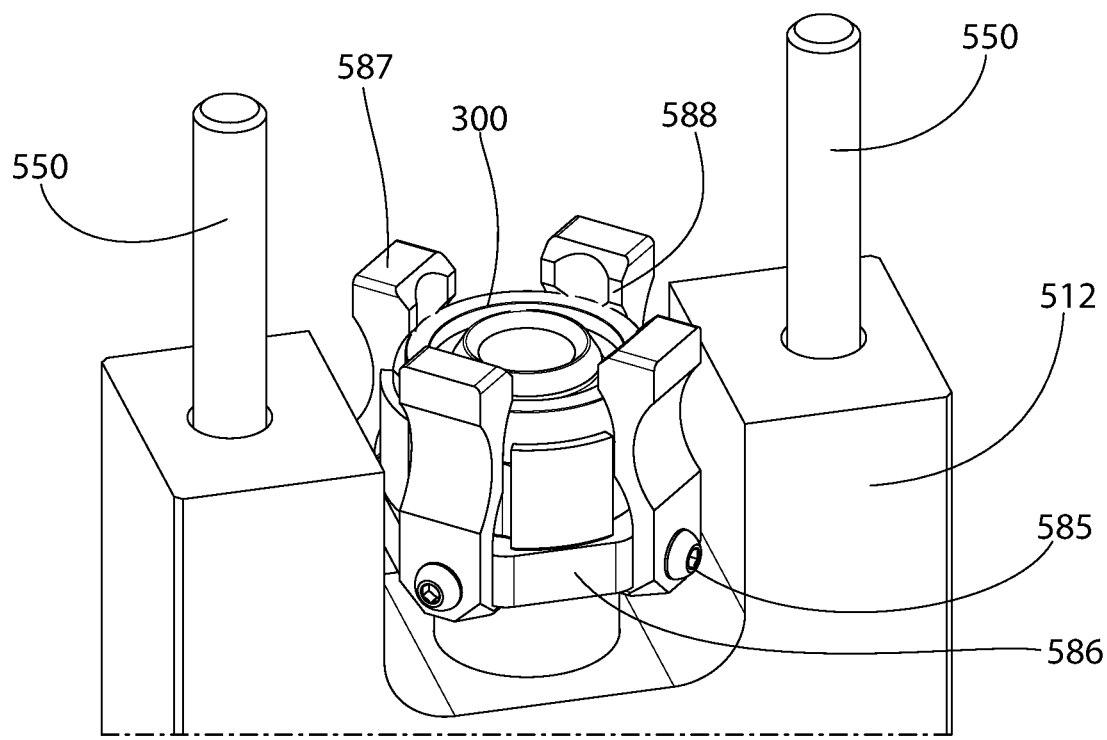
FIG. 12B is a perspective view of the portion of the seal insertion tool of FIG. 12A showing the end effector with the grippers present.

FIGS. 12A and 12B show views of a portion of the seal insertion tool 500 in greater detail. As can be seen, FIG. 12A shows the plunger 570 without the gripper 585. 12B shows the gripper 585 in place, along with a seal 300.

Figure 13A:
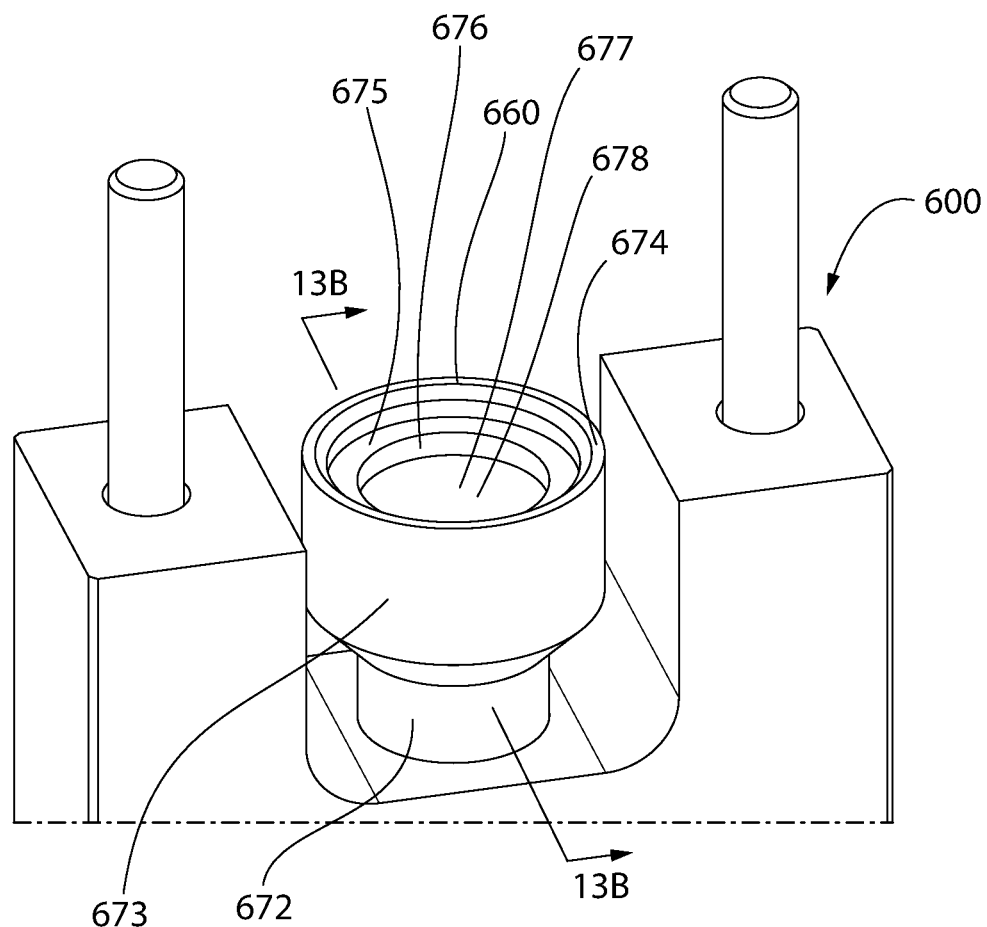
FIG. 13A is a perspective view of a portion of an alternate embodiment of the seal insertion tool showing an alternate end effector.
Figure 13B:
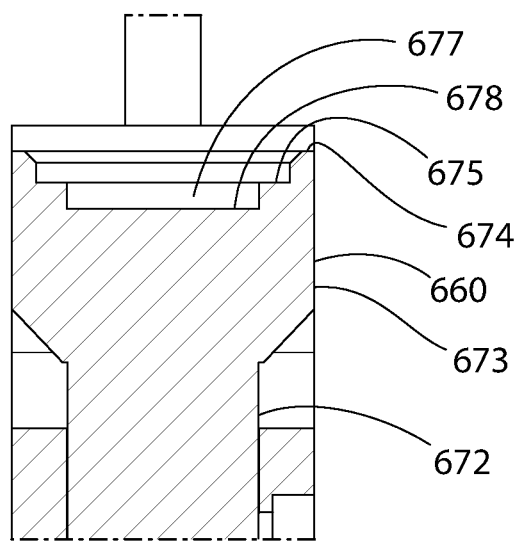
FIG. 13B is a cross-sectional view of the portion of the seal insertion tool of FIG. 13A, taken along line 13B-13B.

FIGS. 13A and 13B show an alternate embodiment of the seal insertion tool 600. The seal insertion tool 600 has an end effector 660 having a plunger head 673 and a plunger shaft 672. However, the seal insertion tool 600 omits the gripper of the seal insertion tool 500. The end effector 660 of the seal insertion tool 600 has an end face 674 that forms a lowermost surface of the plunger head 673. The end effector 660 also has a work surface 675 to engage the outer upstanding ring wall 306, a depression 677, a floor 678, and an annular wall 676. The depression 677, floor 678, and annular wall 676 serve to avoid contact between the end effector 660 and the inner upstanding ring wall 308. The top surface 314 of the inner upstanding ring wall 308 is spaced from the floor 678, preventing undesired deformation of the seal 300.

The seal insertion tool 600 functions substantially identically to the seal insertion tool 500, but does not grip the seal 300 during installation. Instead, the user places the seal 300 on the substrate block 104 and then installs the seal insertion tool 600. The actuator 502 is then actuated to seat the seal 300.

Turning to FIGS. 14A-D, an embodiment of a torque limiting device for a seal insertion tool is shown. The present embodiment combines one of the seal insertion tools 500, 600 previously disclosed with a torque module 1000 to preclude the need for a separate torque driver. In FIGS. 14A-D, the seal insertion tool 600 is shown, but either embodiment could be utilized with the torque module 1000. The torque module 1000 can be engaged with the top of the seal insertion tool 500 and act as an add-on component. As shown, the torque module 1000 has a handle 1002 for operation by a user and thumb screws 1003 and shafts 1005 to engage the tool fasteners 550.

Figures 14A, 14B:
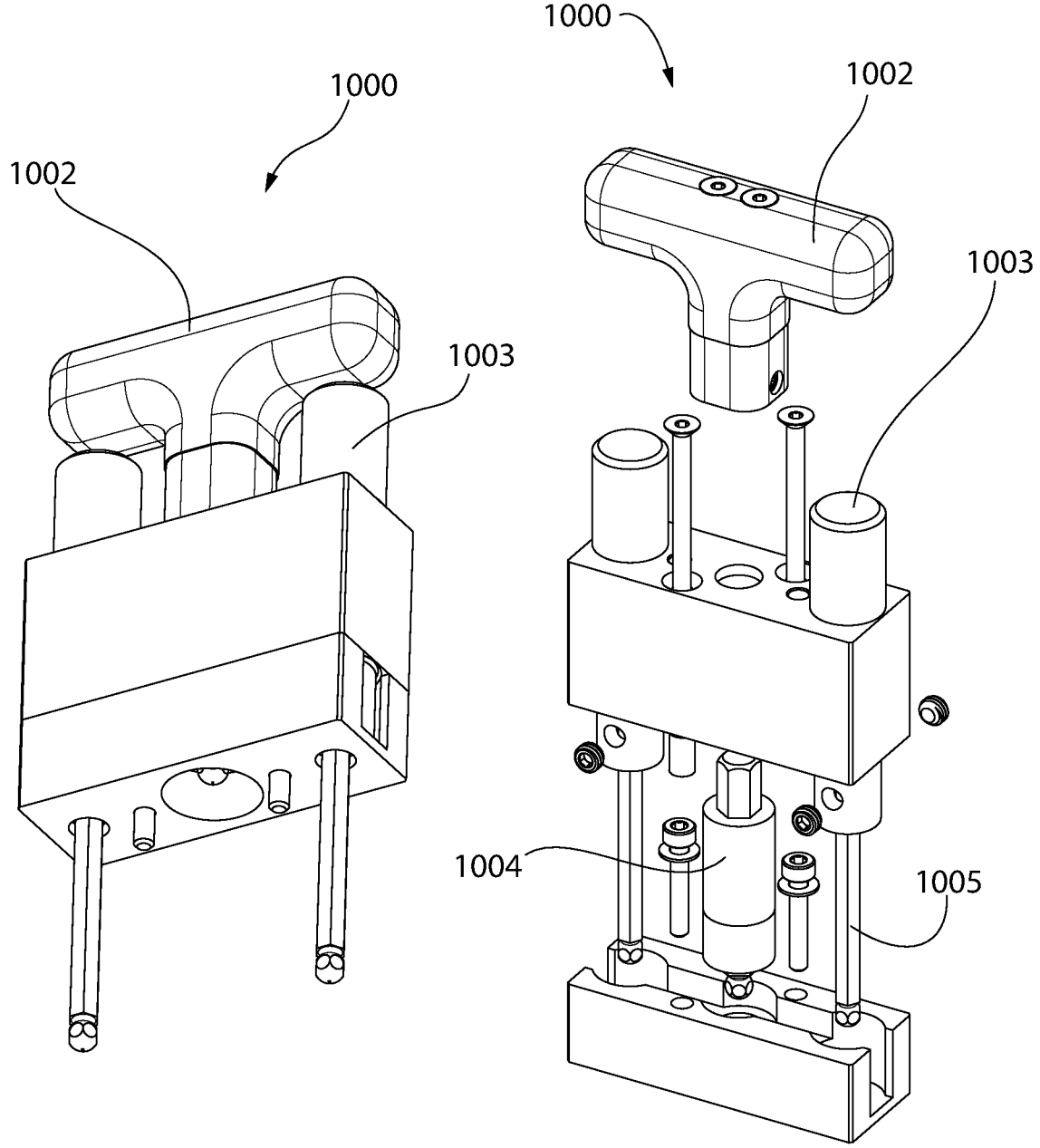
FIG. 14A is a perspective view of a torque limiting attachment for a seal insertion tool.
FIG. 14B is an exploded view of the torque limiting attachment of FIG. 14A.
Figure 14C:
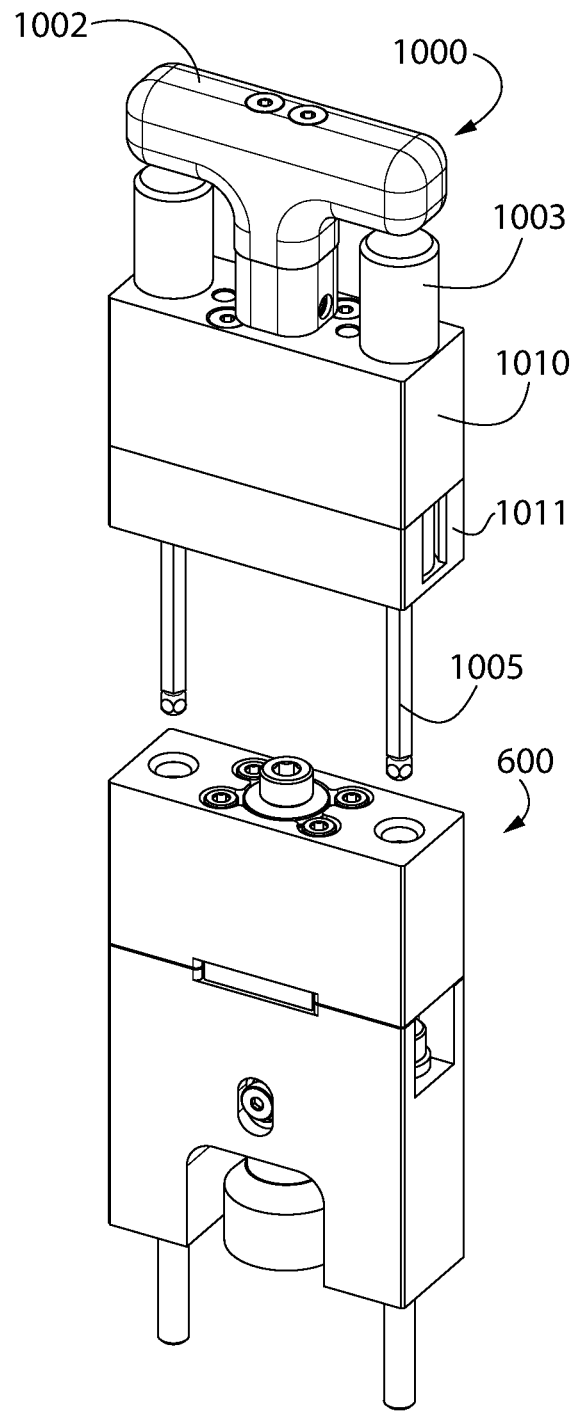
FIG. 14C is a perspective view of the torque limiting attachment positioned above the seal insertion tool of FIG. 13A.
Figure 14D:
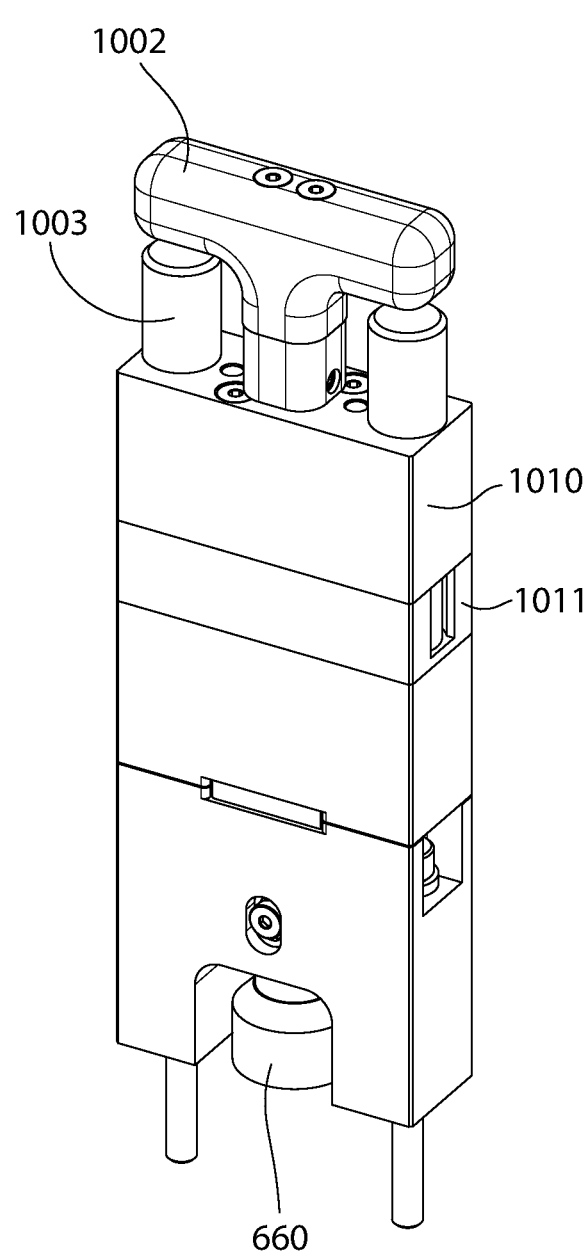
FIG. 14D is a perspective view of the torque limiting attachment assembled with the seal insertion tool of FIG. 13A.

As shown in FIGS. 14C and 14D, the torque module 1000 installs directly onto the seal insertion tool 600. The torque module 1000 has a torque limiter 1004 housed within an upper body 1010 and a lower body 1011. The torque limiter 1004 may be a friction clutch based device or any other known torque limiting device. The torque module 1000 may be attached by bolts, magnets, adhesives, a snap-interface, or any other known method.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A method of installing an annular seal in a fluid delivery module of a fluid supply line that extends from a fluid source to a process chamber, the method comprising:
   a) coupling a seal insertion tool loaded with an annular seal to a first substrate block of the fluid delivery module so that the annular seal is positioned above and aligned with a first fluid port located on a first surface of the first substrate block; and
   b) actuating the seal insertion tool so that the seal insertion tool lowers the annular seal and presses a lower portion of the annular seal into a first annular groove of the first fluid port that surrounds a first fluid opening of the first fluid port;
   wherein steps a) and b) are performed while the fluid delivery module remains in-situ within the fluid supply line.

2. The method according to claim 1 wherein, prior to step a) and while the fluid delivery module remains in-situ within the fluid supply line, the method further comprising:
   decoupling a first active flow component from the first substrate block of the fluid delivery module to expose the first fluid port on the first surface of the first substrate block, the first substrate block comprising a first fluid passageway that extends from the first fluid opening of the first fluid port to a second fluid opening of a second fluid port on the first substrate block; and
   removing an expired seal.

3. The method according to claim 2 wherein the active flow component comprises a component block having a bottom surface and a first component fluid port on the bottom surface; wherein when the active flow component is coupled to the first substrate block of the fluid delivery module, an areal portion of the bottom surface overlies and opposes a portion of the first surface of the first substrate block; and wherein the seal insertion tool has a footprint that fits within the areal portion of the bottom surface of the component block.

4. The method according to claim 2 further comprising:
d) decoupling the seal insertion tool from the first substrate block to expose the first fluid port, the annular seal remaining in place within the first annular groove; and
e) coupling the first active flow component to the first substrate block so that an upper portion of the annular seal is pressed into a component annular groove of a component fluid port located on a bottom surface of a component block of the first active flow component, the annular seal hermetically sealing the first fluid opening of the first fluid port to a component fluid opening of the component fluid port.

5. The method according to claim 4 wherein the fluid delivery module comprises a plurality of anchors, wherein the seal insertion tool is coupled to the first substrate block during step a) the anchors being the same anchors that are used to couple the first active flow component to the first substrate block in step e).

6. The method according to claim 1 wherein when the seal insertion tool is coupled to the first substrate block of the fluid delivery module according to step a), a footprint of the seal insertion tool is contained within a footprint of the first substrate block.

7. The method according to claim 1 further comprising:
the first substrate block comprising a second fluid port having a second fluid opening and a first fluid passageway extending between the first and second fluid openings;
the fluid delivery module comprising a second active flow component coupled to the first substrate block and fluidly coupled to the second fluid port;
wherein during the performance of steps a) and b), the second active flow component remains fluidly coupled to the second fluid port; and
wherein the second fluid port is on the first surface.

8. The method according to claim 1 further comprising:
the seal insertion tool comprising a pair of tool fasteners extending through fastener passageways in a body of the seal insertion tool;
wherein step a) comprises activating the pair of tool fasteners to engage a corresponding pair of anchors located in either the first substrate block or a support structure of the fluid delivery module to which the first substrate block is mounted; and
wherein the pair of tool fasteners are threaded tool fasteners and the pair of anchors are threaded anchors; and wherein step a) comprises rotating the pair of threaded tool fasteners to engage the pair of threaded anchors located in the support structure of the fluid delivery module to which the first substrate block is mounted, the pair of threaded tool fasteners extending through fastener passageways of the first substrate block.

9. The method according to claim 1 wherein the first substrate block and additional components of the fluid delivery module remain mounted to a support structure of the fluid delivery module during steps a) and b).

10. The method according to claim 1 wherein step b) further comprises:

b-1) rotating an actuator of the seal insertion tool, thereby causing an end effector of the seal insertion tool in which the annular seal is loaded to translate from a raised state to a lowered state.

11. The method according to claim 10 wherein in the raised state, the annular seal is engaged and retained by the end effector; and wherein in the lowered state, the end effector has pressed the annular seal into the first annular groove and disengaged the annular seal;
wherein in the lowered state an end face of a plunger of the end effector contacts the first surface of the first substrate block.

12. The method according to claim 10 wherein the end effector comprises a gripper slidably mounted to a plunger having a plunger shaft and a plunger head located at the distal end of the plunger shaft, the gripper comprising a plurality of grip fingers mounted to a collar slidably mounted about the plunger shaft.

13. The method according to claim 12 further comprising:
prior to step a), loading the annular seal into the end effector by inserting the annular seal between the plurality of grip fingers, the grip fingers exerting a radially inward force on the annular seal to engage and retain the annular seal in the end effector, the gripper being in a lowered position relative to the plunger;
wherein when the seal insertion tool is coupled to the first substrate block, the grip fingers contact or are above the first surface of the first substrate block; and
wherein step b) comprises rotating the actuator of the seal insertion tool, thereby lowering the plunger of the end effector, the plunger sliding relative to the gripper and pressing the lower portion of the annular seal into the first annular groove.

14. The method according to claim 13 wherein during step b), the gripping fingers are deflected radially outward by a cam action between the inner surface of the gripping fingers and at least one of the annular seal or the plunger.

15. The method according to claim 1 wherein the annular seal comprises an outer upstanding ring wall, an inner upstanding ring wall, and a flange extending between the inner and outer upstanding ring walls; and wherein the seal insertion tool does not exert any vertical compression force on the inner upstanding ring wall during the performance of step b).

16. The method according to claim 15 wherein the seal insertion tool does not contact the inner upstanding ring wall during the performance of step b).

17. A method of replacing an annular seal in a fluid delivery module, the method comprising:
a) decoupling a first active flow component from a first substrate block of the fluid delivery module by releasing one or more component fasteners that respectively engage one or more anchors of the fluid delivery module, thereby exposing a first fluid port on a first surface of the first substrate block;
b) removing an expired seal;
c) coupling a seal insertion tool to the first substrate block by activating one or more tool fasteners to engage the one or more anchors of the fluid delivery module; and
d) actuating the seal insertion tool so that an annular seal that is aligned with the first fluid port is pressed into a first annular groove of the first fluid port that surrounds a first fluid opening of the first fluid port.

18. The method according to claim 17 further comprising:
e) decoupling the seal insertion tool from the first substrate block to expose the first fluid port, the annular seal remaining in place within the first annular groove; and
f) coupling the first active flow component to the first substrate block by activating the one or more component fasteners to engage the one or more anchors, thereby pressing an upper portion of the annular seal into a component annular groove of a component fluid port located on a bottom surface of a component block of the first active flow component, the annular seal hermetically sealing the first fluid opening of the first fluid port to a component fluid opening of the component fluid port.

* * * * *